(12) United States Patent
Ueda

(10) Patent No.: US 9,209,193 B2
(45) Date of Patent: Dec. 8, 2015

(54) METHOD OF MANUFACTURING DEVICE

(75) Inventor: Yasuhiko Ueda, Tokyo (JP)

(73) Assignee: PS4 LUXCO S.A.R.L., Luxembourg (LU)

( * ) Notice: Subject to any disclaimer, the term of this patent is extended or adjusted under 35 U.S.C. 154(b) by 118 days.

(21) Appl. No.: 13/527,141

(22) Filed: Jun. 19, 2012

(65) Prior Publication Data

US 2012/0329236 A1 Dec. 27, 2012

(30) Foreign Application Priority Data

Jun. 22, 2011 (JP) ................................ 2011-138648

(51) Int. Cl.
*H01L 21/8242* (2006.01)
*H01L 27/108* (2006.01)
*H01L 49/02* (2006.01)
*H01L 21/3213* (2006.01)

(52) U.S. Cl.
CPC .... *H01L 27/10894* (2013.01); *H01L 27/10852* (2013.01); *H01L 28/91* (2013.01); *H01L 21/32134* (2013.01); *H01L 21/32136* (2013.01); *H01L 27/1085* (2013.01); *H01L 27/10808* (2013.01); *H01L 27/10814* (2013.01)

(58) Field of Classification Search
CPC .................. H01L 27/10808; H01L 27/10814; H01L 27/1085; H01L 27/10852; H01L 27/10894; H01L 21/32134; H01L 21/32136; H01L 21/32137

USPC ................. 438/253, 254, 256, 710, 717, 753; 257/303, E21.647, E21.648, E21.218, 257/E21.219

See application file for complete search history.

(56) References Cited

U.S. PATENT DOCUMENTS

| 6,482,695 B1* | 11/2002 | Kim .............................. 438/253 |
| 2001/0044192 A1* | 11/2001 | Takaishi ....................... 438/396 |
| 2008/0081431 A1* | 4/2008 | Roh et al. ..................... 438/397 |
| 2012/0015494 A1* | 1/2012 | Kobayashi et al. ........... 438/386 |
| 2012/0187533 A1* | 7/2012 | Goodner et al. .............. 257/532 |

FOREIGN PATENT DOCUMENTS

JP      2006-135261      5/2006

* cited by examiner

*Primary Examiner* — Kimberly Rizkallah
*Assistant Examiner* — Maria Ligai

(57) ABSTRACT

A method of manufacturing a device includes: forming a fifth insulating film on a semiconductor substrate having a peripheral circuit region and a memory cell region in which a contact pad is formed; forming a second sacrifice film in the memory cell region in which the fifth insulating film is formed; forming, after the forming of the second sacrifice, a second insulating film in the peripheral circuit region on the semiconductor substrate to have a sidewall coming into contact with the second sacrifice film; forming a third insulating film to cover an upper surface of the second sacrifice film and an upper surface of the second insulating film; forming a hole penetrating through the third insulating film, the second sacrifice film and the fifth insulating film in the memory cell region; forming a lower electrode in the hole; and removing all of the second sacrifice film.

20 Claims, 18 Drawing Sheets

METHOD OF MANUFACTURING DEVICE

This application is based upon and claims the benefit of priority from Japanese paten application No. 2011-138648, filed on Jun. 22, 2011, the disclosure of which is incorporated herein in its entirety by reference.

BACKGROUND OF THE INVENTION

The present invention relates a method of manufacturing a semiconductor device, and more particularly to a method of manufacturing a semiconductor device including an electrode having a high aspect ratio.

In a manufacturing process of a semiconductor device, a pattern is formed in a film being processed, such as an interlayer dielectric disposed on a semiconductor substrate, by a dry etching method using a resist mask. As the degree of integration of semiconductor devices increases, finer patterns are formed. Accordingly, a dry etching method has been developed so as to achieve a higher degree of precision corresponding to those finer patterns.

As the degree of integration of semiconductor devices increases, a processing depth tends to increase while a processing area that is processed by dry etching is reduced. Particularly, a "high-aspect-ratio" pattern (i.e. cylindrical hole), which has a high ratio of a processing depth to a processing area, needs to be formed as a hole pattern for forming lower electrodes of capacitors.

However, as an aspect ratio becomes higher, a dry etching method finds difficulty in processing. This is because a sputtering effect of an ionized etching gas is used to dry-etch a silicon oxide film ($SiO_2$), which has widely been used as a material for an interlayer dielectric. Specifically, as a pattern has a higher aspect ratio, more kinetic energy is lost because more ions collide with sidewalls by the time they reach the bottom of the pattern. As a result, the sputtering effect obtained by ions that have reached the bottom of the pattern is also lessened. Thus, a dry etching method finds difficulty in processing as an aspect ratio becomes higher. Furthermore, when a silicon oxide film is dry-etched, fluorine radical is generated from an etching gas including fluorine (F). Because fluorine radical provides isotropic etching, side-etching occurs locally in a sidewall of a hole. Thus, the hole is formed into a bowing shape. If the side-etching proceeds, then adjacent hole patterns may be brought into contact with each other. It is difficult to avoid those phenomena in a dry etching process of a silicon oxide film.

In order to avoid the above phenomena, use of an amorphous carbon film instead of a silicon oxide film has been proposed (see, e.g., JP-A 2006-135261). An amorphous carbon film is hereinafter referred to as an AC film.

In a dry etching process of an AC film, an etching gas being used primarily contains oxygen ($O_2$), and etching is conducted primarily by radical reactions. This etching can be conducted irrespective of attenuation of the kinetic energy of ions. Furthermore, a pattern having a high aspect ratio can be formed with high accuracy by using an additive gas to suppress occurrence of bowing due to radical reactions.

SUMMARY

However, carbon in an AC film is an obstacle to a semiconductor fabrication process. Therefore, an AC film used to form cylindrical holes should completely be removed afterward.

Meanwhile, a cylindrical hole is used to form a lower electrode of a capacitor. A support film connecting a plurality of lower electrodes to each other is formed on the AC film in order to prevent the lower electrodes from being collapsed and brought into contact with each other when the AC film is removed. However, when the AC film is removed, the support film loses its base so that it does not have strength sufficient to prevent collapse of the lower electrodes. Accordingly, use of an AC film suffers from problems that lower electrodes may be collapsed or broken.

The present invention seeks to solve one or more of the above problems, or to improve upon those problems at least in part.

In one embodiment, there is provided a method that includes: forming a fifth insulating film on a semiconductor substrate having a peripheral circuit region and a memory cell region in which a contact pad is formed; forming a second sacrifice film in the memory cell region in which the fifth insulating film is formed; forming, after the forming of the second sacrifice film, a second insulating film in the peripheral circuit region on the semiconductor substrate to have a sidewall coming into contact with the second sacrifice film; forming a third insulating film to cover an upper surface of the second sacrifice film and an upper surface of the second insulating film; forming a hole penetrating through the third insulating film, the second sacrifice film and the fifth insulating film in the memory cell region; forming a lower electrode in the hole; and removing all of the second sacrifice film.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF PREFERRED EMBODIMENTS

In order to facilitate understanding of the present invention, a method of manufacturing a related semiconductor device will be described prior to explanation of the present invention. There will be described a method of manufacturing a DRAM including capacitors having a high aspect ratio.

Figure 1:
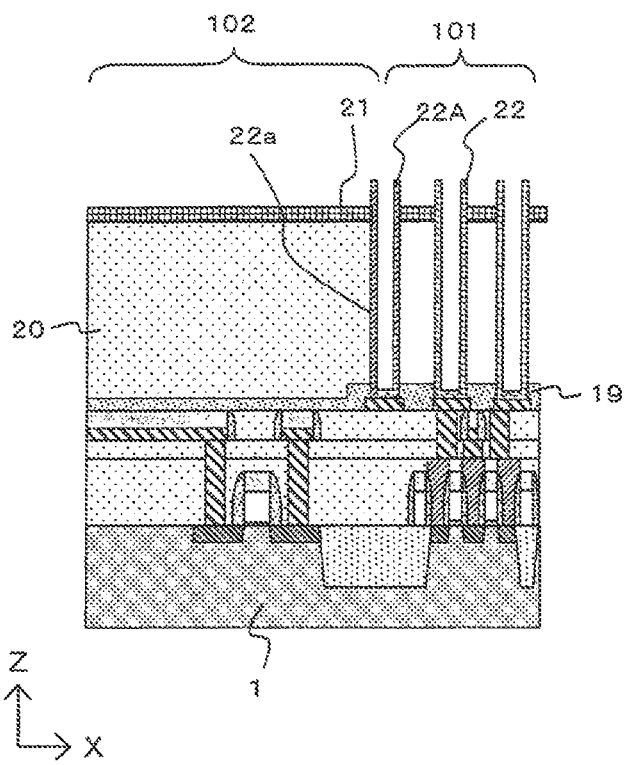
FIG. 1 is a vertical cross-sectional view showing that a support film supports lower electrodes formed by a related method of manufacturing a semiconductor device.

A first method of manufacturing a related semiconductor device will be described below. The first method uses a silicon oxide film as an interlayer dielectric used to form capacitors. FIG. 1 is a cross-sectional view of a DRAM during a manufacturing process using a silicon oxide film.

First, manufacturing steps to obtain a state of FIG. 1 will be described.

A memory cell region 101 and a peripheral circuit region 102 are defined on a surface of a semiconductor substrate 1. Functional devices and interconnections are formed in those regions.

Then a cover film 19, a (fourth) interlayer dielectric 20, and a support film 21 are stacked on the semiconductor substrate 1 on which the devices and the like have been formed. Each of the cover film 19 and the support film 21 is formed of a silicon nitride film. The interlayer dielectric 20 is formed of a silicon oxide film. The support film 21 serves as a beam for preventing collapse of lower electrodes (22), which will be formed in a later step.

Subsequently, a mask film having a cylindrical hole pattern (not shown) is formed on the support film 21. While the mask film is used as a mask, cylindrical holes are formed in the memory cell region 101. At that time, a dummy trench is formed in a boundary between the memory cell region 101 and the peripheral circuit region 102. The dummy trench is in the form of a guard ring surrounding the memory cell region 101.

Thereafter, a conductive material layer is formed on the entire surface of the structure on the semiconductor substrate 1. The conductive material layer is etched back so that lower electrodes 22 and a guard ring 22A are formed in the cylindrical holes and the dummy trench, respectively.

Next, the mask film is removed so that a surface of the support film 21 is exposed. An opening is formed in the exposed support film 21 at any desired location of the memory cell region 101. No opening is formed in the support film 21 located in the peripheral circuit region 102. Then the semiconductor substrate 1 is immersed in a solution containing hydrofluoric acid, so that part of the interlayer dielectric 20 located in the memory cell region 101 is removed through the opening formed in the support film 21. At that time, the support film 21 remains because the etching rate of the support film 21 is low. Furthermore, the interlayer dielectric 20 remains in the peripheral circuit region 102, which is covered with the support film 21. Thus, lower electrodes 22 having a crown structure in which its inner and outer walls are exposed are formed as shown in FIG. 1.

As shown in FIG. 1, the support film 21 remains in the memory cell region 101 even though the interlayer dielectric 20 has been removed. This support film 21 connects the lower electrodes 22 to each other. The support film 21 is also connected to the guard ring 22A. The support film 21 spreads over the peripheral circuit region 102.

The interlayer dielectric 20 remaining in the peripheral circuit region 102 contacts an outer wall 22a of the guard ring 22A and thus supports the guard ring 22A. Furthermore, the interlayer dielectric 20 serves as a base for supporting the support film 21. With this structure, the support film 21 is supported by the guard ring 22A and the interlayer dielectric 20. Therefore, the support film 21 can have a mechanical strength required for preventing collapse of the lower electrodes 22. However, as the aspect ratio of cylindrical holes increases, it becomes difficult to form a cylindrical hole in the interlayer dielectric 20 made of the silicon oxide film as mentioned above. Therefore, it is difficult to apply this method to production of a minute DRAM.

Figure 2:
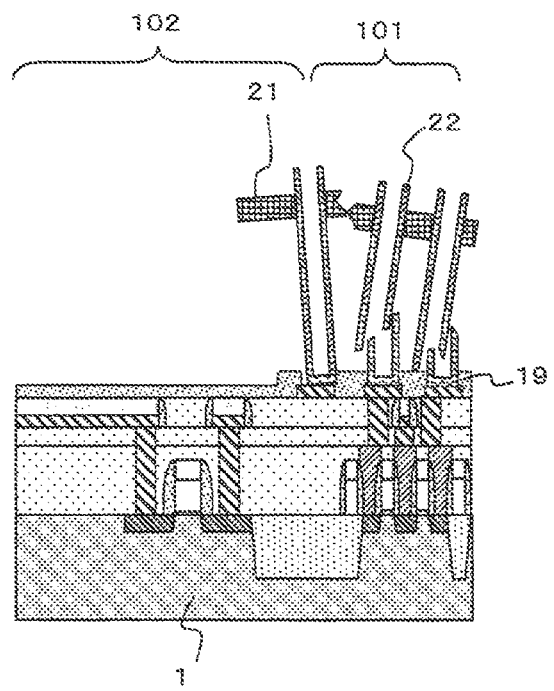
FIG. 2 is a vertical cross-sectional view showing a possible problem that may arise in a case of a combination of the related method and an amorphous carbon film.

A second method of manufacturing a related semiconductor device will be described below in reference to FIG. 2. The second method uses an AC film. When an AC film is used, the same steps as described above are performed except that an AC film is used instead of the interlayer dielectric 20. Since carbon in the AC film is an obstacle to subsequent processes, the AC film must be completely removed after formation of the lower electrodes.

First, a cover film 19 is formed on the entire surface of the semiconductor substrate 1 on which the devices and the like have been formed. Then an AC film is formed on the entire surface of the cover film 19. Furthermore, a support film 21 for preventing collapse of lower electrodes is formed on the entire surface of the AC film.

Thereafter, a mask film is formed on the support film 21. While the mask film is used as a mask, cylindrical holes are formed in the AC film of the memory cell region 101. At that time, a dummy trench is formed in the boundary between the memory cell region 101 and the peripheral circuit region 102.

Subsequently, a conductive material layer is formed on the entire surface of the structure on the semiconductor substrate 1. The conductive material layer is etched back so that lower electrodes 22 and a guard ring 22A are formed in the cylindrical holes and the dummy trench, respectively.

Thereafter, the mask film is removed so that a surface of the support film 21 is exposed. An opening is formed in the exposed support film 21 at any desired location of the memory cell region 101. At that time, part of the support film 21 located in the peripheral circuit region 102 is also removed in order to completely remove the AC film as described above.

Next, the AC film is removed by a dry etching method using oxygen plasma, which can etch the AC film isotropically.

The AC film is all removed by the above steps. As a result, the support film 21, which serves as a beam, loses a base that has supported the support film 21. Consequently, the support film 21 cannot have a mechanical strength required for preventing collapse of the lower electrodes 22. Therefore, the lower electrodes 22 may be collapsed or broken as shown in FIG. 2. Thus, the method using an AC film suffers from problems that the lower electrodes 22 may be collapsed or broken.

The invention will be described hereinafter with reference to illustrative embodiments. Those skilled in the art will recognize that many alternative embodiments can be accomplished using the teachings of the present invention and that the invention is not limited to the embodiments illustrated for explanatory purposes. In the following description, a dynamic random access memory (DRAM) is illustrated as an example of a semiconductor device. Nevertheless, the present invention is applicable to semiconductor devices other than a DRAM.

First Embodiment

Figure 3:
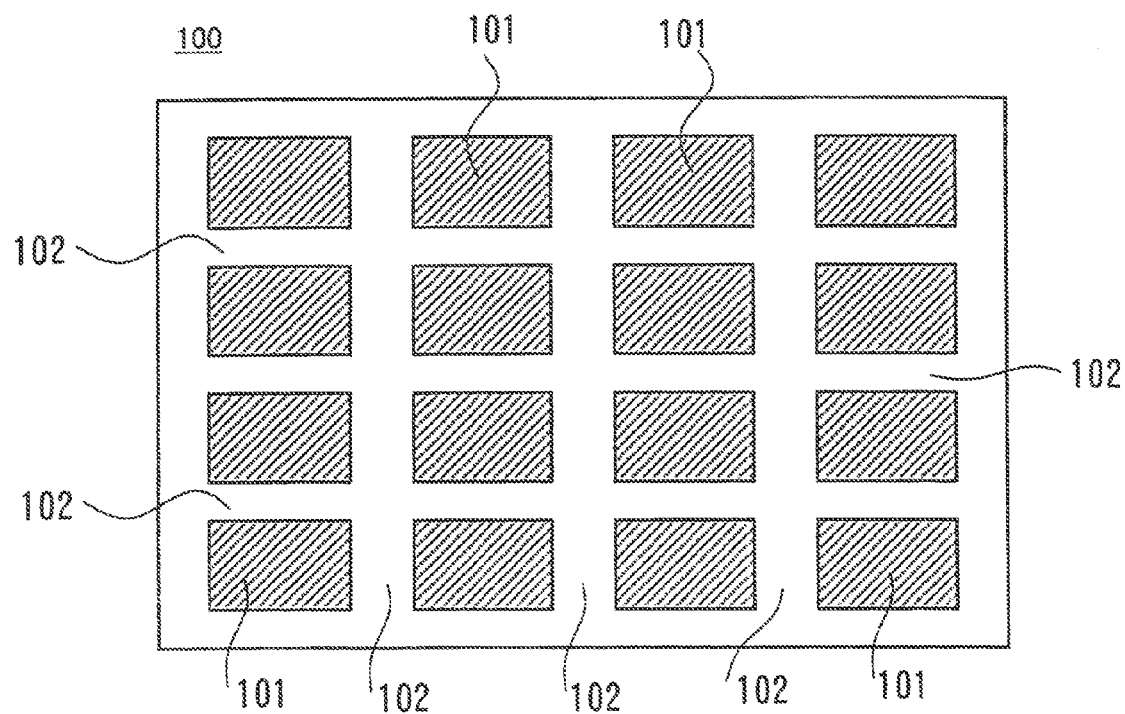
FIG. 3 is a conceptual diagram showing an example of a two-dimensional arrangement of a semiconductor device to which the present invention is applied.

FIG. 3 is a conceptual diagram showing a two-dimensional arrangement of a semiconductor device (DRAM) 100 produced by a method of manufacturing a semiconductor device according to a first embodiment of the present invention.

The DRAM 100 of FIG. 3 roughly includes a plurality of memory cell regions (first regions) 101 being arrayed and a peripheral circuit region (second region) 102 arranged so as to surround peripheries of the memory cell regions 101.

Each of the memory cell regions 101 includes a number of memory cells being arrayed. The memory cells include cell capacitors and cell transistors. Sense amplifier circuits, driving circuits for word lines, input/output circuits, and the like are formed in the peripheral circuit region 102. The arrangement of FIG. 3 is presented by way of example. The number and arrangement of the memory cell regions 101 are not limited to the layout of FIG. 3.

Figure 4:
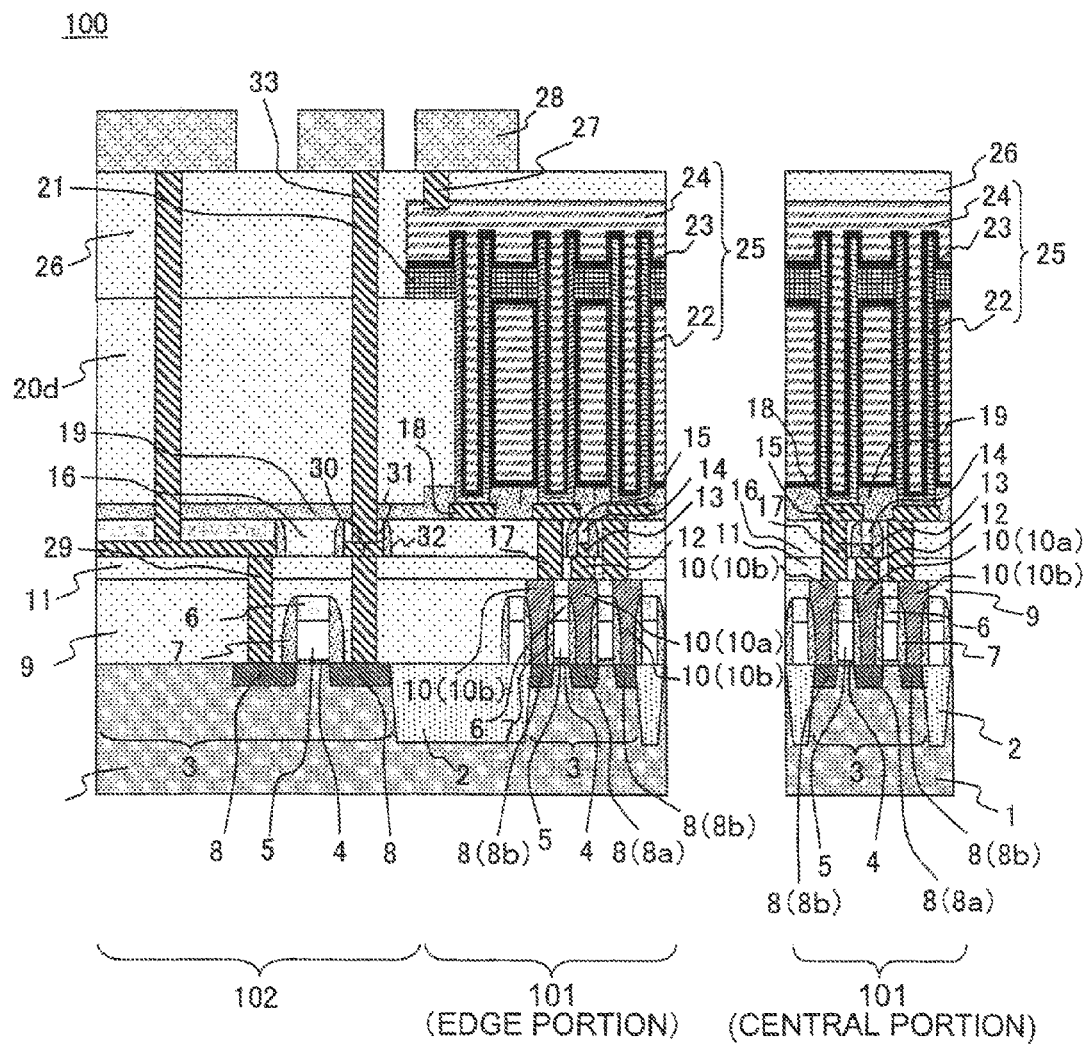
FIG. 4 is vertical cross-sectional views showing an outlined structure of a semiconductor device produced by a method of manufacturing a semiconductor device according to a first embodiment of the present invention.

FIG. 4 is a partial cross-sectional view showing an outlined structure of the DRAM 100. FIG. 4 shows the peripheral circuit region 102, a boundary area (or edge portion) of the memory cell region 101 adjacent to the peripheral circuit region 102, and a central portion of the memory cell region 101, in order from the left.

The DRAM 100 has a semiconductor substrate 1. The semiconductor substrate 1 may be a monocrystalline silicon substrate, which is hereinafter referred to as a silicon substrate 1. The silicon substrate 1 includes shallow trench isolations (STIs) 2 formed therein as a device isolation region. The silicon substrate 1 also includes active regions 3 surrounded by the STIs 2. The STIs 2 and the active regions 3 are formed in each of the memory cell region 101 and the peripheral circuit region 102.

The DRAM 100 has a plurality of planer MOS transistors formed in the active regions 3. Each of the planer MOS transistors includes a gate insulating film 4 provided on a surface of the silicon substrate 1, a gate electrode 5 provided so that the gate insulating film 4 is covered with the gate electrode 5, and a diffusion layer 8 provided around a portion located below the gate insulating film 4. The diffusion layer 8 serves as a source or a drain. The gate electrode 5 has an upper surface covered with an insulating film 6 and a sidewall covered with a sidewall insulating film 7. The diffusion layer 8 is not located right below the gate insulating film 4 and is located at an upper portion of the silicon substrate 1 on which no gate insulating film 4 is formed and in a region that is covered with a first interlayer dielectric 9. The diffusion layer 8 has a conductive type inverse to the conductive type of the silicon substrate 1.

For the sake of convenience, only two MOS transistors are illustrated in the active region 3 at the central portion of the memory cell region 101 shown in FIG. 4. In practice, several thousands to several hundreds of thousands of MOS transistors are arranged in the active region 3. Furthermore, though the MOS transistors are shown as a planer-type in FIG. 4, they are not limited thereto. The MOS transistors may be a trench gate type or an embedded gate type.

First contact plugs 10 are connected to the diffusion layers 8 in the memory cell region 101. Those first contact plugs 10 extend through the first interlayer dielectric 9. The first contact plugs 10 are positioned between the sidewall insulating films 7 of adjacent planer MOS transistors.

The diffusion layers 8 in the memory cell region 101 can be classified into two diffusion layers 8a and 8b. The first contact plugs 10a connected to the diffusion layer 8a are connected to second contact plugs 12, which extend through a second interlayer dielectric 11. The first contact plugs 10b connected to the diffusion layer 8b are connected to third contact plugs 17, which extend through the second interlayer dielectric 11 and a third interlayer dielectric 16.

First wires 13, which serve as bit lines, are formed on the second interlayer dielectric 11. Each of those first wires 13 is connected to the second contact plug 12 and covered with an insulating film 14 and a sidewall insulating film 15.

Contact pads 18 are formed on the third interlayer dielectric 16 for maintaining an alignment margin between crown type capacitors 25, which will be described later, and the third contact plugs 17. Each of the contact pads 18 is connected to the third contact plug 17 located below the contact pad 18.

Crown type capacitors 25 are provided on the contact pads 18 so as to extend through a cover film 19 (fifth insulating film), which protects the third interlayer dielectric 16. Each of the crown type capacitors 25 includes a lower electrode 22, a capacitance insulating film 23, and an upper electrode 24. The lower electrode 22 is connected to the contact pad 18.

Each of the crown type capacitors 25 has side surfaces connected to a support film 21 (third insulating film) provided for preventing collapse of the crown type capacitors 25. In other words, adjacent crown type capacitors 25 support each other via the support film 21.

The upper electrodes 24 of the crown type capacitors 25 are covered with a fifth interlayer dielectric 26 and connected to fourth contact plugs 27 provided in the fifth interlayer dielectric 26. The fourth contact plugs 27 are connected to second wires 28 formed on the fifth interlayer dielectric 26.

The diffusion layers 8 in the peripheral circuit region 102 are connected to fifth contact plugs 29. The fifth contact plugs 29 extend through the first interlayer dielectric 9 and the second interlayer dielectric 11.

Third wires 30 are formed on the second interlayer dielectric 11. The third wires 30 are connected to the fifth contact plugs 29. Each of the third wires 30 is covered with an insulating film 31 and a sidewall insulating film 32.

The third wires 30 and the insulating films 31 are covered with the cover film 19 (fifth insulating film). The fourth interlayer dielectric 20d (second insulating film) and the fifth interlayer dielectric 26 are formed on the cover film 19. Furthermore, sixth contact plugs 33 are provided so as to extend through the cover film 19, the fourth interlayer dielectric 20d, and the fifth interlayer dielectric 26. The second wires 28 and the third wires 30 are connected to each other by the sixth contact plugs 33.

The present invention particularly relates to a step of forming the capacitors 25 on the contact pads 18 in the aforementioned manufacturing process of the DRAM 100 thus constructed. Now the manufacturing process of the DRAM 100 will be described with reference to FIGS. 5A to 16B.

FIGS. 5A to 16B are diagrams explanatory of a manufacturing process of the DRAM 100. Figures with the label A are plan views while figures with the label B shows cross-sections taken along line B-B of corresponding figures with the label A. The plan views illustrate components on an upper surface in the respective steps of the manufacturing process. Other (invisible) primary components located below the upper surface may be indicated by broken lines.

Figure 5A:
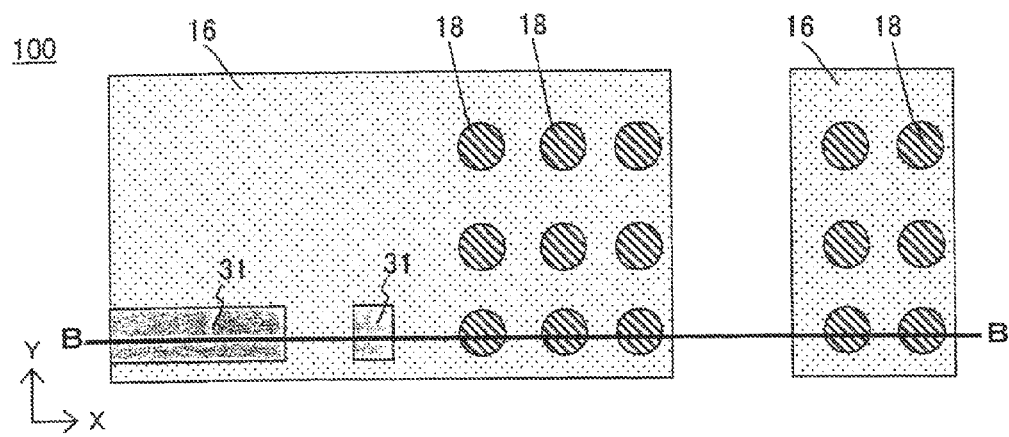
FIG. 5A is a plan view explanatory of a method of manufacturing a semiconductor device according to the first embodiment of the present invention.
Figure 5B:
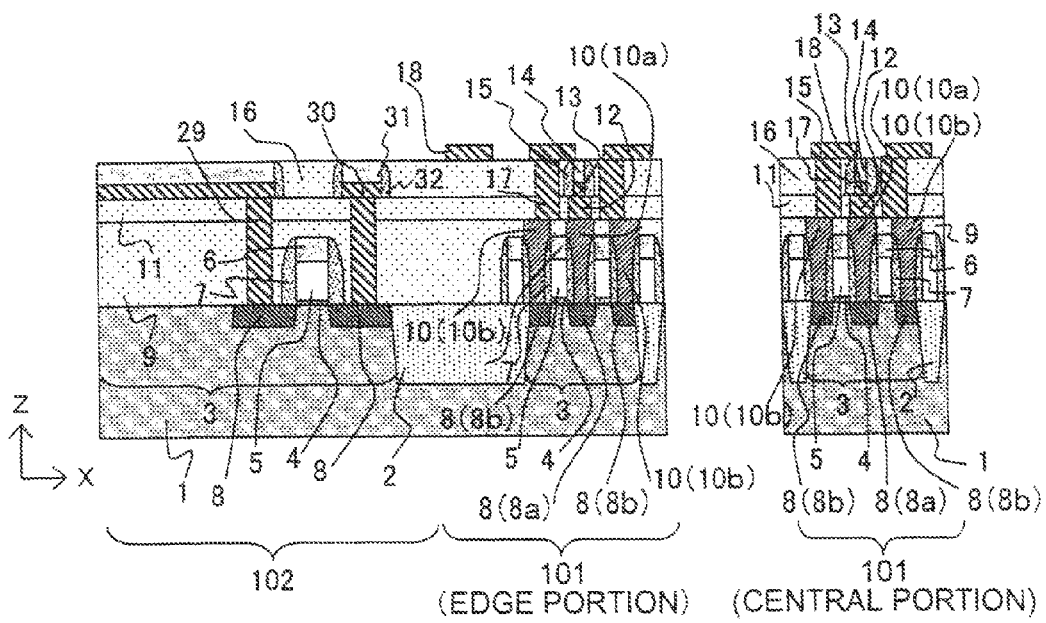
FIG. 5B shows a vertical cross-section taken along a line B-B of FIG. 5A.

First, in order to obtain a state shown in FIGS. 5A and 5B, STIs 2 are formed as a device isolation region in the silicon substrate 1, and active regions 3 are defined. A silicon oxide film ($SiO_2$) or a silicon nitride film (SiN) may be used for the STIs 2.

Then a gate insulating film 4, a gate electrode 5, and an insulating film 6 are sequentially formed on the silicon substrate 1. The gate insulating film 4 may be a silicon oxide film formed on a surface of the silicon substrate 1 by a thermal oxidation method. The gate electrode 5 may be a polysilicon layer formed by a thermal chemical vapor deposition (CVD) method or a tungsten (W) layer formed by a CVD method. The insulating film 6 may be a silicon nitride film formed by a plasma CVD method.

Subsequently, while the insulating film 6 is used as a mask, etching is conducted so as to form planer MOS transistors. Thereafter, side portions of the transistors thus formed are covered with a sidewall insulating film 7. The sidewall insulating film 7 may be a silicon nitride film formed by a thermal CVD method. The gate electrode 5 forming a part of the planer type MOS transistor extends in Y direction to form a word line of the DRAM.

Next, diffusion layers 8 are formed around the transistors in the silicon substrate 1 by an ion implantation method. A first interlayer dielectric 9 is formed so that the transistors are embedded in the first interlayer dielectric 9. Then a surface of the first interlayer dielectric 9 is flattened. The first interlayer dielectric 9 may be formed by using a spin-on dielectrics (SOD) made of a coat insulating material. The first interlayer dielectric 9 may be flattened by using a chemical mechanical polishing (CMP) method.

Subsequently, a photoresist is applied onto the first interlayer dielectric 9. Openings (holes) having a desired shape are formed in desired locations of the photoresist by photolithography. The openings are positioned above any desired diffusion layers 8.

Thereafter, dry etching is conducted while the photoresist having holes is used as a mask, so that first holes (not shown) are formed in the first interlayer dielectric 9. Then a conductive film is formed so that the first holes are filled with the conductive film. Subsequently, an extra conductive film formed on the first interlayer dielectric is removed. Polysilicon by a thermal CVD method or tungsten by a CVD method may be used for the conductive film, and the extra conductive film may be removed by using a CMP method. Thus, the first holes are filled with the conductive film, so that first contact plugs 10 connected to the diffusion layers 8 are formed.

Next, a second interlayer dielectric 11 is deposited on the first interlayer dielectric 9. The second interlayer dielectric 11 may be a silicon oxide film formed by a plasma CVD method. Thereafter, second contact plugs 12 are formed by the same method as the method of forming the first contact plugs 10 so that they are embedded in the second interlayer dielectric 11 of the memory cell region 101. At the same time, fifth contact plugs 29 are formed so that they are embedded in the second interlayer dielectric 11 and the first interlayer dielectric 9 of the peripheral circuit region 102. The second contact plugs 12 are connected to the first contact plugs 10, and the fifth contact plugs 29 are connected to the diffusion layers 8. Tungsten may be used as a material for the second contact plugs 12 and the fifth contact plugs 29.

Then a tungsten film and a silicon nitride film are sequentially deposited on the second interlayer dielectric 11. The tungsten film may be deposited by using a sputtering method. The silicon nitride film may be deposited by using a plasma CVD method. The tungsten film and the silicon nitride film on the second interlayer dielectric 11 are patterned by photolithography and dry etching. Thus, first wires 13 and an insulating film 14 are formed in the memory cell region 101, and third wires 30 and an insulating film 31 are formed in the peripheral circuit region 102. The first wires 13 are connected to the second contact plugs 12, and the third wires 30 are connected to the fifth contact plugs 29. The first wires 13 functions as bit lines extending in a direction perpendicular to the word line.

Subsequently, side portions of the first wires 13 are covered with a sidewall insulating film 15, and side portions of the third wires 30 are covered with a sidewall insulating film 32. Those sidewall insulating films 15 and 32 can be formed by the same process. For example, the sidewall insulating films 15 and 32 may be a silicon nitride film formed by a thermal CVD method.

Thereafter, a third interlayer dielectric 16 is formed by using an SOD method. The first wires 13 and the third wires 30 are embedded in the third interlayer dielectric 16. Then a surface of the third interlayer dielectric 16 is flattened by a CMP method.

Subsequently, a photoresist is applied onto the third interlayer dielectric 16. Next, holes are formed at desired locations of the photoresist by photolithography. The holes being formed are located above desired first contact plugs 10. Furthermore, second holes (not shown) are formed in the third interlayer dielectric 16 and the second interlayer dielectric 11 by using dry etching method while the photoresist having holes is used as a mask. Thereafter, the photoresist is removed.

Next, a conductive film is formed so that the second holes are filled with the conductive film. Then an extra conductive film formed on the third interlayer dielectric 16 is removed. Polysilicon by a thermal CVD method or tungsten by a CVD method may be used for the conductive film. Furthermore, the extra conductive film may be removed by using a CMP method. Herewith, third contact plugs 17 connected to the first contact plugs 10 are formed in the third interlayer dielectric 16 and the second interlayer dielectric 11.

Thereafter, a conductive film is formed on the third interlayer dielectric 16. The conductive film is patterned by using photolithography and dry etching method, so that contact pads 18 are formed. Polysilicon into which impurities have been doped by a thermal CVD method or W by a CVD method may be used for the conductive film.

In the aforementioned manner, the state shown in FIGS. 5A and 5B is obtained.

Figure 6A:
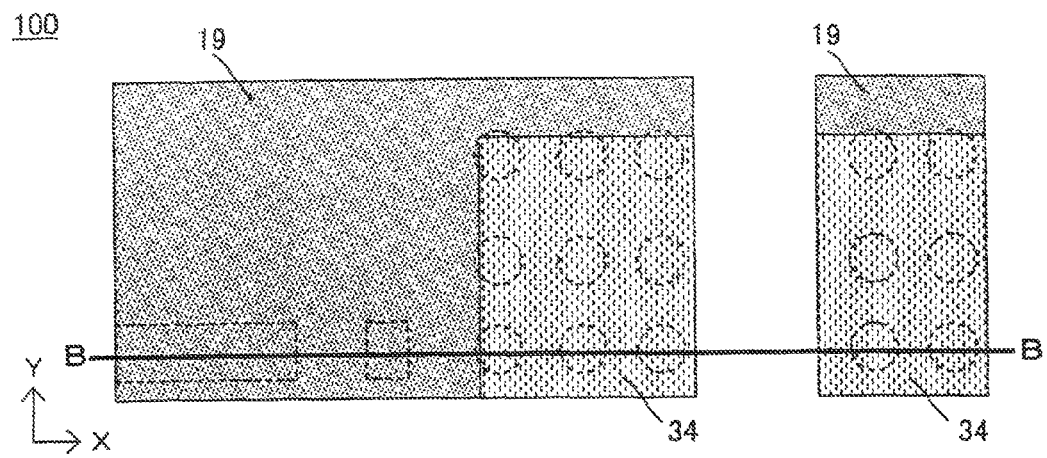
FIG. 6A is a plan view explanatory of a step following the step of FIGS. 5A and 5B.
Figure 6B:
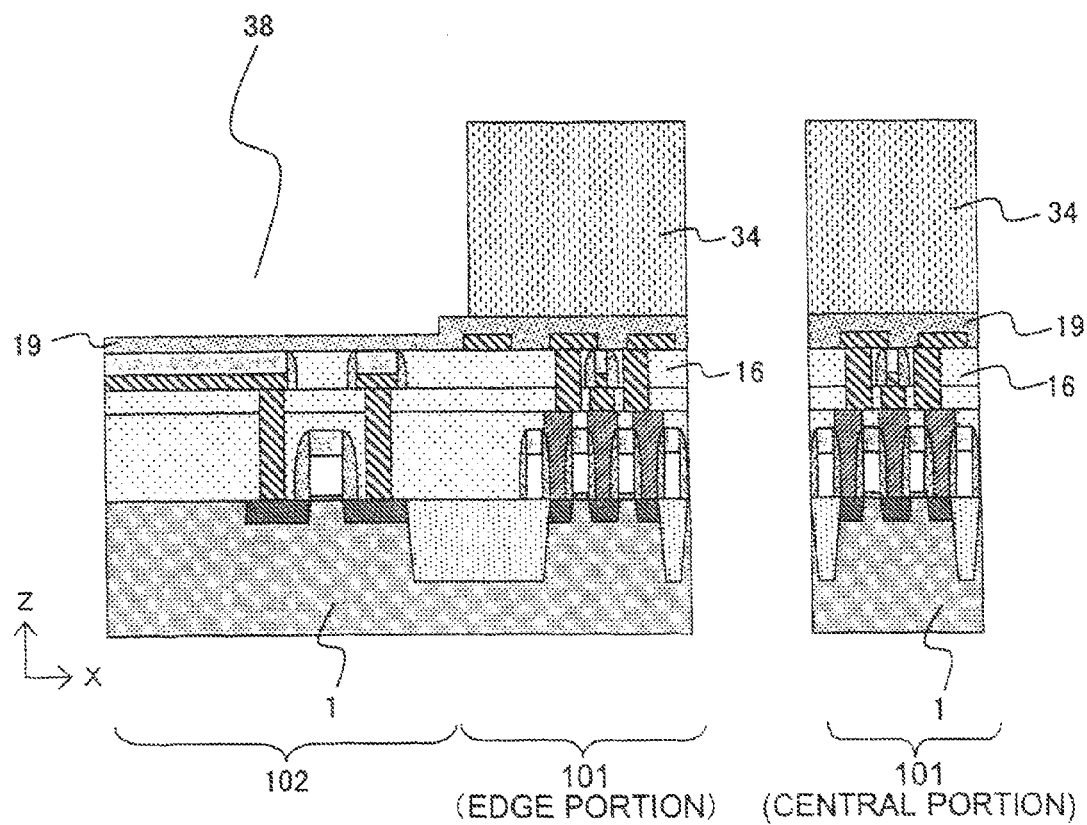
FIG. 6B shows a vertical cross-section taken along a line B-B of FIG. 6A.

Next, in order to obtain a state shown in FIGS. 6A and 6B, a cover film 19 (fifth insulating film) is deposited on the third interlayer dielectric 16 to cover the contact pads 18. The cover film 19 may be a silicon nitride film formed by a thermal CVD method and having about 50 nm thickness. The cover film 19 serves as an over etching prevention film when a cylindrical hole forming process is conducted later.

Then a first sacrifice film (34) having about 1000 nm thickness is deposited on the entire surface of the cover film 19 (fifth insulating film). The first sacrifice film may be an amorphous carbon film or a silicon film. Though the silicon film may be polycrystalline silicon film, amorphous silicon film is preferable because it can be removed in a shorter time in comparison with a case of the polycrystalline silicon film.

In a case of the amorphous carbon film, the first sacrifice film may be formed using plasma CVD method, for example. The following deposition conditions may be used: Propylene ($C_3H_6$) is used as a raw material gas, the flow rate is set at 1,000 sccm (standard cubic centimeter per minute), the high-frequency power is set at 1,000 W, the heating temperature is set at 500° C., and the pressure is set at 3 Torr. Helium (He) may be used as a carrier gas.

Similarly, in a case of the amorphous silicon, the first sacrifice film may be formed using plasma CVD method, for example. The following deposition conditions may be used: Monosilane ($SiH_4$) is used as a raw material gas, the temperature is set at 400° C. to 500° C. and the pressure is set at 3 Torr. The amorphous silicon film includes hydrogen when it is formed by the plasma CVD method using the monosilane as the raw material gas. A content of hydrogen in the amorphous silicon film is increased as the temperature for forming the amorphous silicon film is decreased. When the amorphous silicon with high content of hydrogen is subject to heat treating in a later process such as an insulating film forming process, it is possible that hydrogen cohere and expand so that the amorphous silicon film explodes. In order to avoid such a situation, it is preferable that the amorphous silicon film is formed at a temperature over 400° C. Besides, in order to accelerate an etching speed of the amorphous silicon film in a later process for removing the sacrifice film, impurities may be included in the amorphous silicon film. For that purpose, phosphine ($PH_3$) or the like may be used in addition to the monosilane. Flow rates of raw gases are adjusted so that impurity concentration in the amorphous silicon film is in a range from 1E20 to 1E21 (atoms/$cm^3$). The polycrystalline silicon film can be obtained by heat treating of a temperature over 600° C. subjected to the amorphous silicon film.

Next, all or some of the first sacrifice film (34) formed on the cover film 19 (fifth insulating film) in the peripheral circuit region 102 is removed by anisotropic dry etching using photolithography and dry etching method, so that a groove 38 is formed around the memory cell region 101. Herewith, part of the first sacrifice film (34) remains on the caver film 19 in the memory cell region 101. The remaining part of the first sacrifice film becomes a second sacrifice film 34. Part of the cover film 19 (fifth insulating film) is exposed at the bottom of the groove 38.

When the amorphous carbon film is used as the first sacrifice film, oxygen plasma is used for the anisotropic dry etching for the first sacrifice film. The oxygen plasma can not etch the cover film 19 made of the silicon nitride film. On the other hand, when the amorphous silicon film is used as the first sacrifice film, a mixed gas plasma, containing hydrogen bromide (HBr), chlorine ($Cl_2$) and oxygen, is used. The mixed gas plasma slightly etches the cover film 19 made of the silicon nitride. However, the over-etching amount is about 1 nm. Accordingly, the mixed gas plasma do not etch the cover film 19 made of the silicon nitride substantially.

Figure 7A:
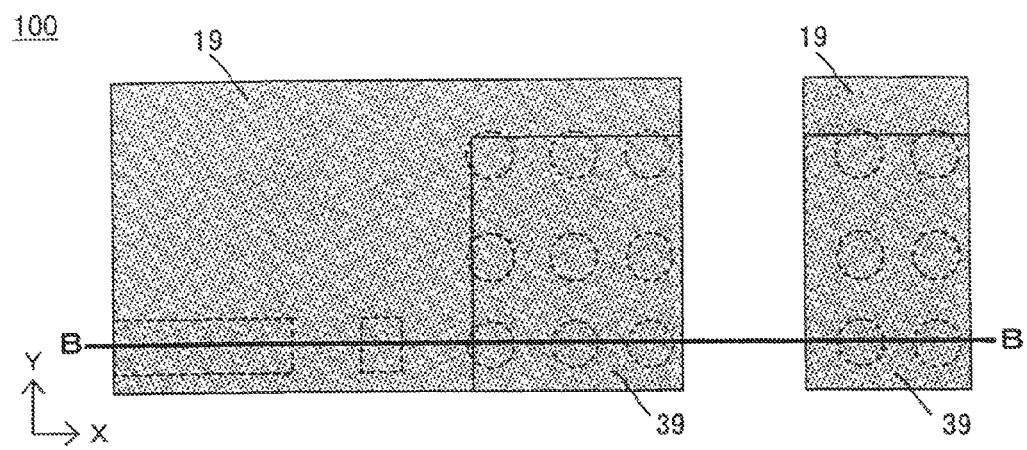
FIG. 7A is a plan view explanatory of a supplementary step following the step of FIGS. 6A and 6B.
Figure 7B:
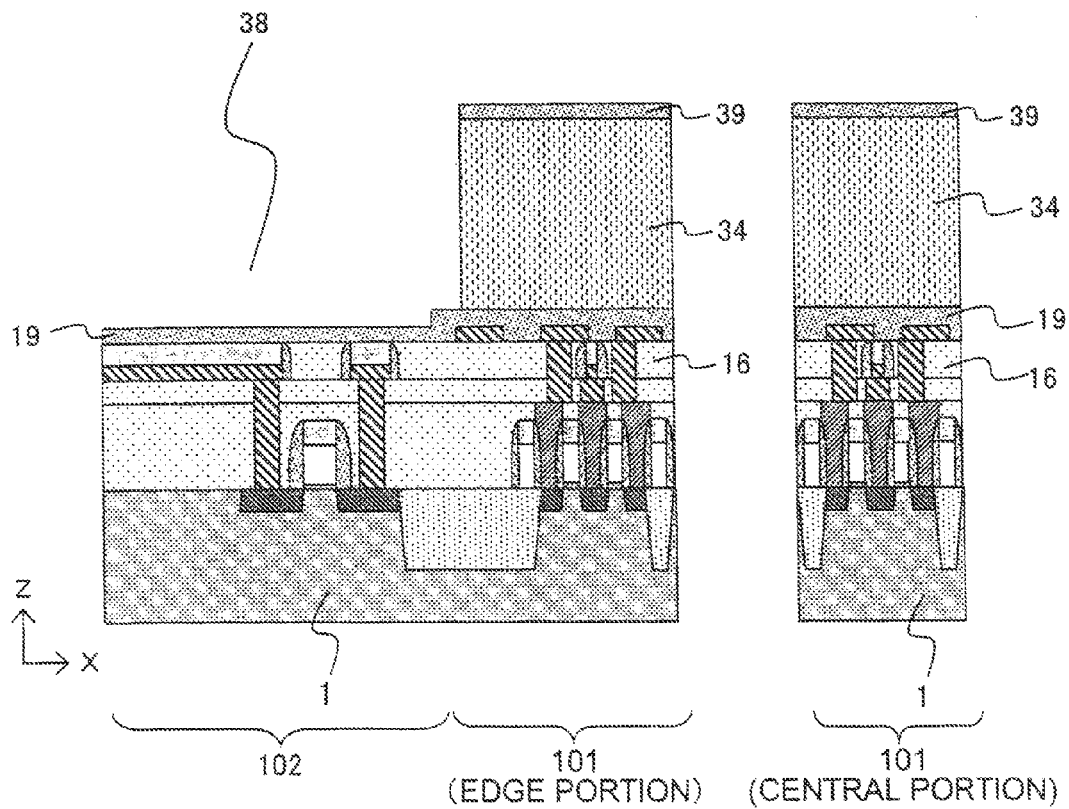
FIG. 7B shows a vertical cross-section taken along a line B-B of FIG. 7A.

A protective film 39 (FIGS. 7A and 7B) may be formed on the first sacrifice film of about 30 nm thickness before the formation of the groove 38. The protective film 39 may be a silicon nitride film formed by a plasma CVD method. Part of the protective film 39 is removed in order to form the groove 38. In such a case, as shown in FIGS. 7A and 7B, the rest of the protective film 39 remains on the second sacrifice film 34 after the formation of the groove 38.

As mentioned above, the second sacrifice film 34 if formed by using photolithography and dry etching method. Then, the oxygen plasma is also used to remove a photoresist used as a mask. When the first sacrifice film is made of the amorphous carbon film, there is the possibility that the oxygen plasma etches the amorphous carbon film and thereby reducing the thickness of the amorphous carbon. The protective film 39 prevents the thickness of the amorphous carbon from reducing. Besides, the protective film 39 can be used as a part of a support film (third insulating film) 21 which is formed later. Moreover, the protective film 39 made of the silicon nitride can be used as a stopper film when a first insulating film 20 is flattened using the CMP method. Additionally, when the first sacrifice film is made of the amorphous silicon film, the first sacrifice film is not etched by the oxygen plasma. Accordingly, it is unnecessary to form the protective film 39 in this case. However, it is preferable to form the protective film 39 because it can be used as the stopper in the CMP process as mentioned above.

Figure 8A:
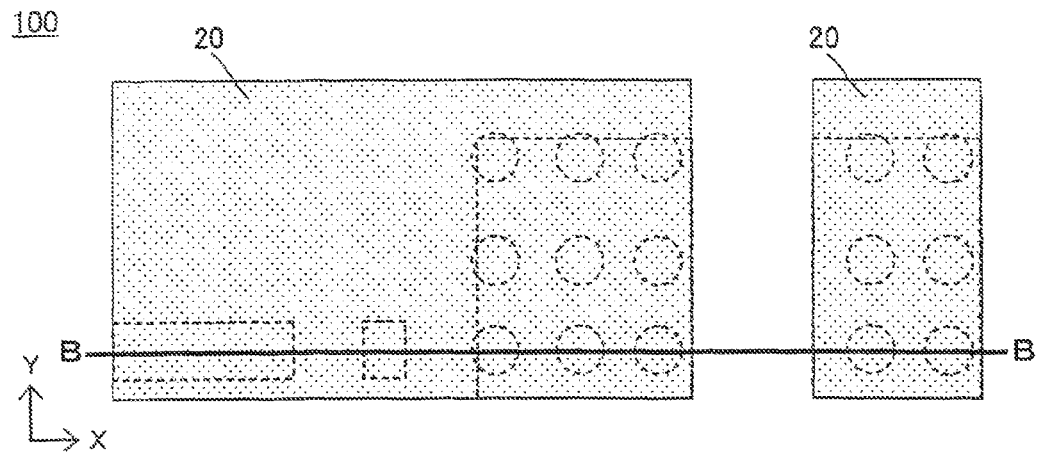
FIG. 8A is a plan view explanatory of a step following the step of FIGS. 6A and 6B.
Figure 8B:
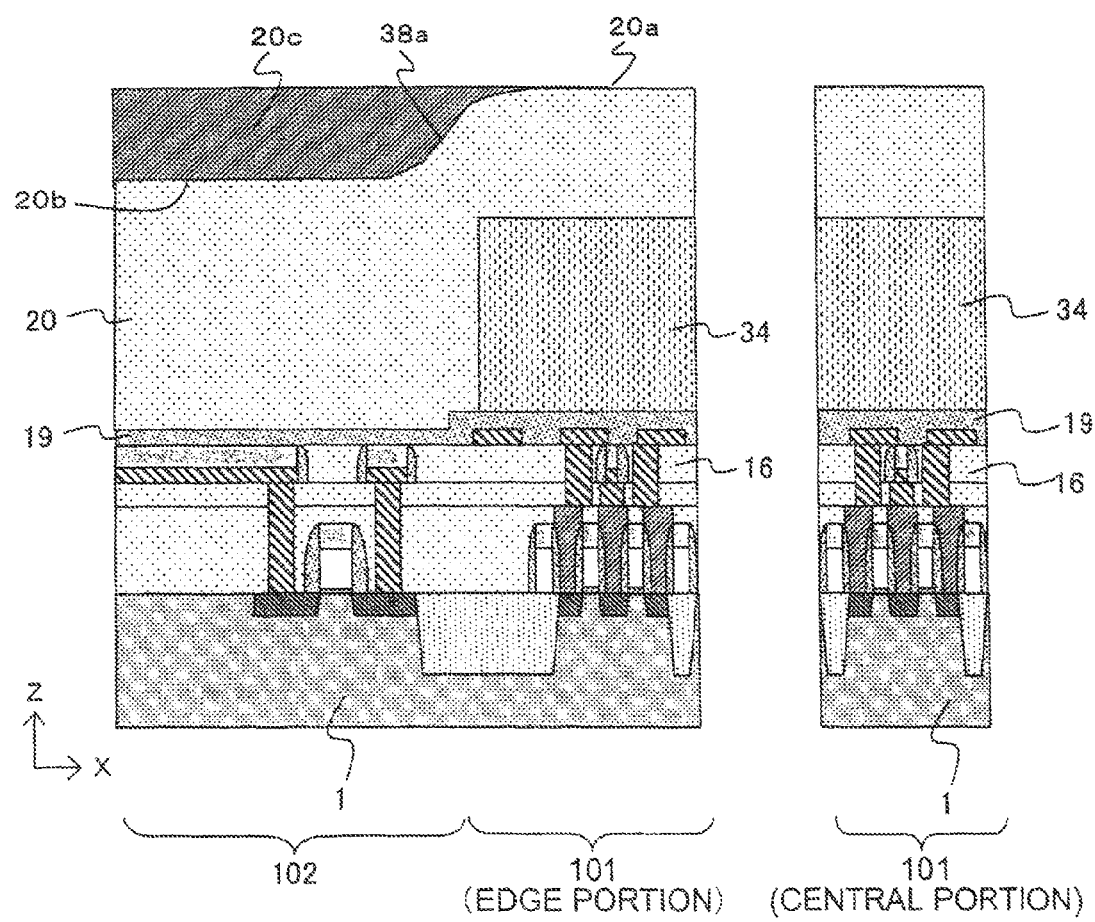
FIG. 8B shows a vertical cross-section taken along a line B-B of FIG. 8A.
Figure 9A:
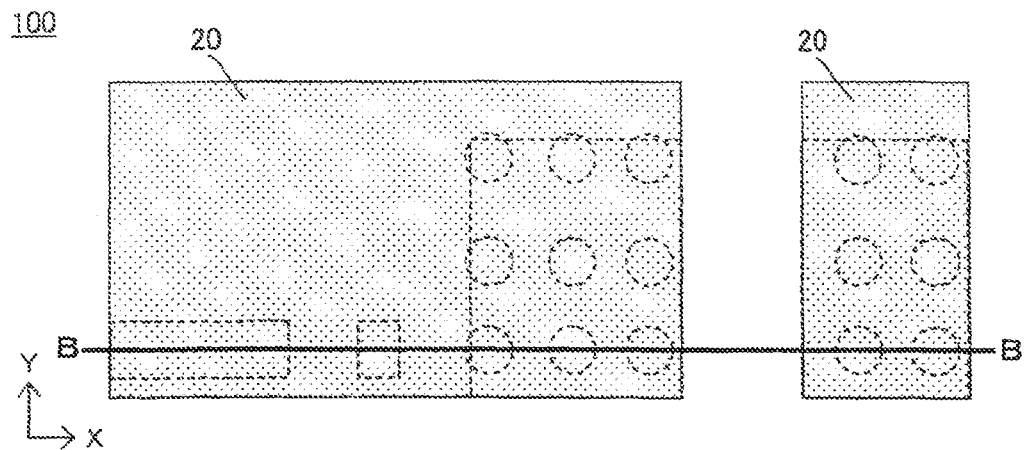
FIG. 9A is a plan view explanatory of a step following the step of FIGS. 7A and 7B.
Figure 9B:
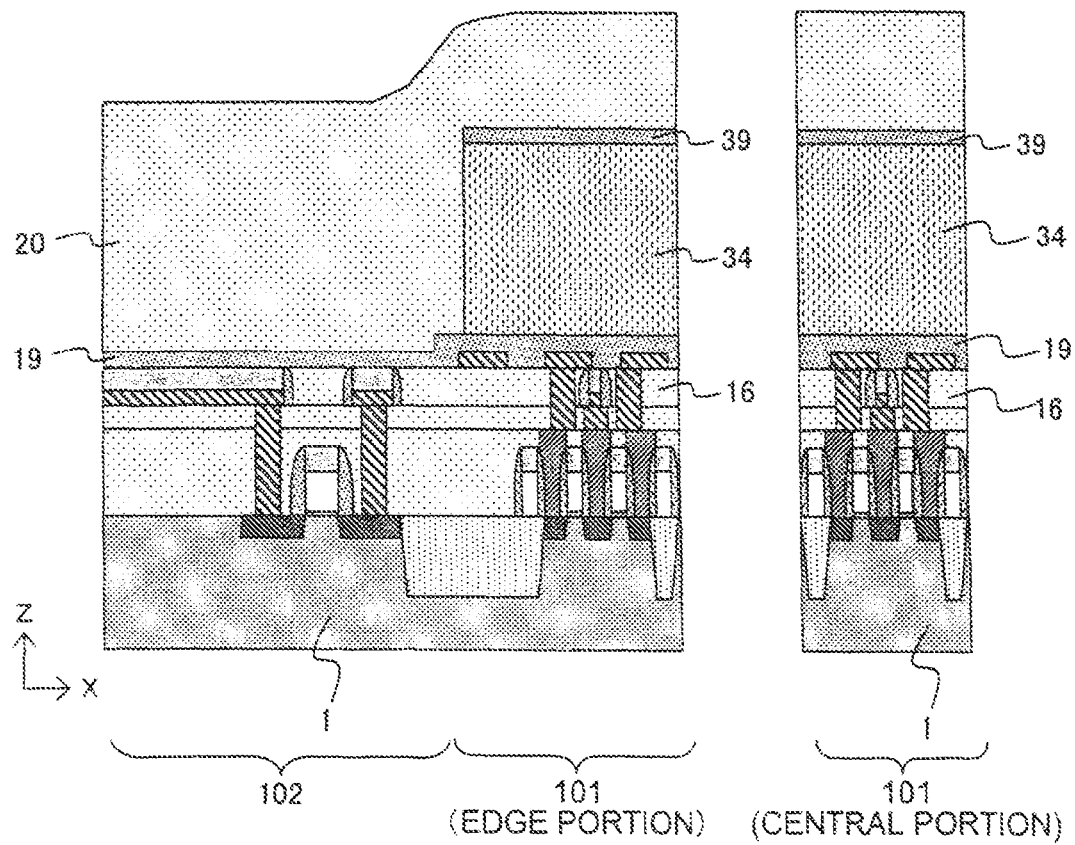
FIG. 9B shows a vertical cross-section taken along a line B-B of FIG. 9A.

Then, as shown in FIGS. 8A and 8B, a first insulating film (20) is formed to fill the groove 38 and to cover the second sacrifice film 34 on the memory cell region 101. It is necessary to form the first insulating film 20 with a material that can not be etched when the second sacrifice film 34 is removed afterward. In other words, it is necessary to form the first insulating film 20 (or a second insulating film 20*d* mentioned later) with a material that can not be etched by the etching condition for the second sacrifice film 34. In addition, it is necessary to form the first insulating film 20 with not conductor but insulator. In this embodiment, the first insulating film 20 may be formed with a silicon oxide film (SiO), a silicon nitride (SiN) or a silicon oxynitride. These films may be formed by using a plasma CVD method. Raw material gases are appropriately selected from monosilane, oxygen ($O_2$) and ammonia ($NH_3$). In a case where the second sacrifice film 34 has a thickness of 1000 nm, it is preferable that the first insulating film 20 is 1100-1200 nm in thickness. Hereby, the first insulating film 20 with a thickness mentioned above is formed on the upper surfaces of the cover film 19 (fifth insulating film) in the peripheral circuit region 102 and the second sacrifice film 34. As a result, a level difference corresponding to the film thickness is caused between an upper surface 20*a* of part of the first insulating film 20 formed on the second sacrifice film 34 and an upper surface 20*b* of part of the first insulating film 20 formed on the cover film 19. That is, a groove 38*a* similar to the groove 38 shown in FIG. 6B is formed in the peripheral region 102. Accordingly, the first insulating film 20 should be partly removed to have a flattened upper surface. In the case where the protective film 39 is provided, as shown in FIGS. 9A and 9B, a first insulating film 20 is formed to cover the protective film 39.

Figure 10A:
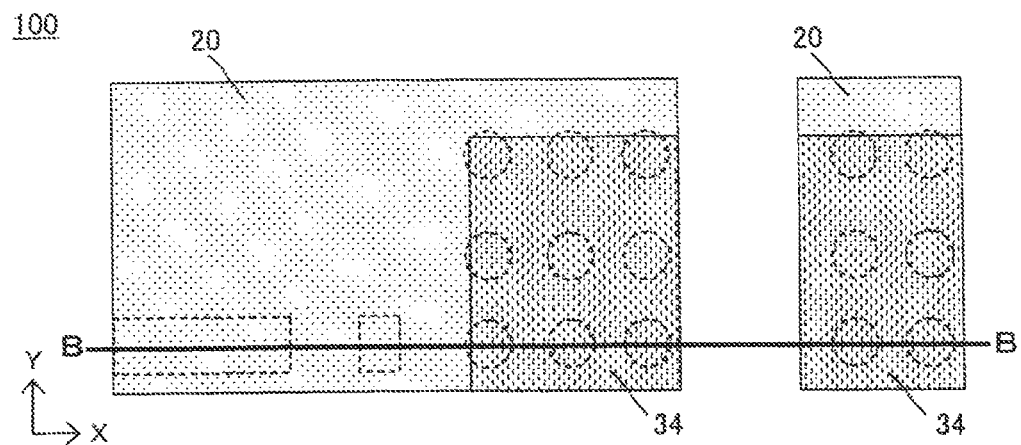
FIG. 10A is a plan view explanatory of a step following the step of FIGS. 8A and 8B.
Figure 10B:
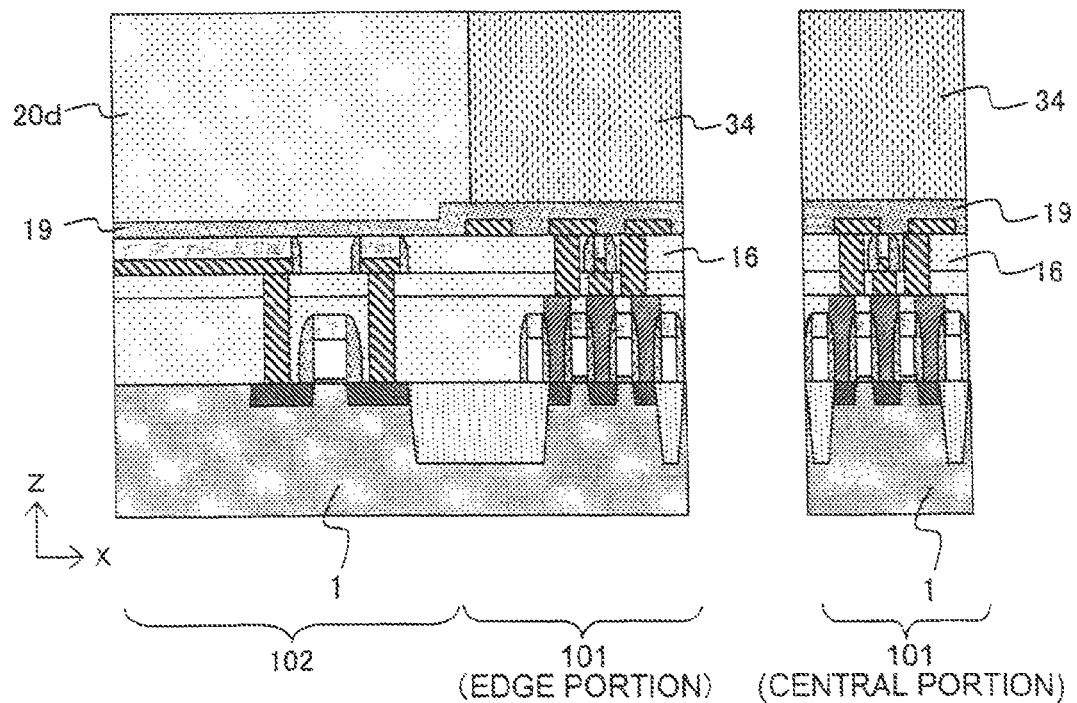
FIG. 10B shows a vertical cross-section taken along a line B-B of FIG. 10A.

Subsequently, as shown in FIGS. 10A and 10B, the part of the first insulating film 20 formed on the upper surface of the second sacrifice film 34 is polished by the CMP method and removed. Because the peripheral circuit region 102 is large, not only the upper surface 20a (FIG. 8B) of the first insulating film 20 formed on the second sacrifice film 34 but also the upper surface 20b of the first insulating film 20 formed on the cover film 19 in the peripheral region 102 is polished when the second upper surface 20b is exposed. This causes reduction of the thickness of the first insulating film 20 in the peripheral circuit region 102. In order to avoid the film thickness reduction, as illustrated in FIG. 8B, a coating insulating film (SOG (spin on glass) film) 20c may be formed by a spin coating method to fill the groove 38a. Thus, the groove 38 is embedded with the coating insulating film 20c having an upper surface which is flush with the upper surface 20a of the first insulating film 20 formed on the second sacrifice film 34. When CMP is conducted in such a state, the state shown in FIGS. 10A and 10B is certainly obtained. That is, the part of the first insulating film 20 formed on the upper surface of the second sacrifice film 34 is removed while the other part of the first insulating film 20 remains in the groove 38 to be the second insulating film 20d. The second insulating film 20d is also serves as the forth interlayer dielectric 20d. Thus, the upper surface of the second insulating film 20d and the upper surface of the second sacrifice film 34 are located on the same plane.

In the case where the protective film 39 is provided, the first insulating film 20 is polished by CMP such that a polished surface of the first silicon oxide film 20 is flush with a surface of the protective film 39. The protective film 39 formed of a silicon nitride film can serve as a stopper for CMP. Therefore, in this case, the protective film 39 prevents excessive removal of the first insulating film 20 formed in the peripheral circuit region 102. Accordingly, the second insulating film 20d can readily be flattened. The protective film 39 may be removed by etching-back. However, the protective film 39 may be left and used as part of the support film 21 (third insulating film) by stacking the support film 21 formed on the protective film 39 in the following process. In this embodiment, the second insulating film 20d is formed in the peripheral circuit region 102 after the second sacrifice film 34 is formed. This is because there is a problem that the amorphous carbon film formed on the second insulating film can not be polished and removed by CMP in a case where the second sacrifice film 34 is made of the amorphous carbon film and the amorphous carbon film is formed after the second insulating film 20d is formed in the peripheral circuit region 102.

Figures 11A, 11B:
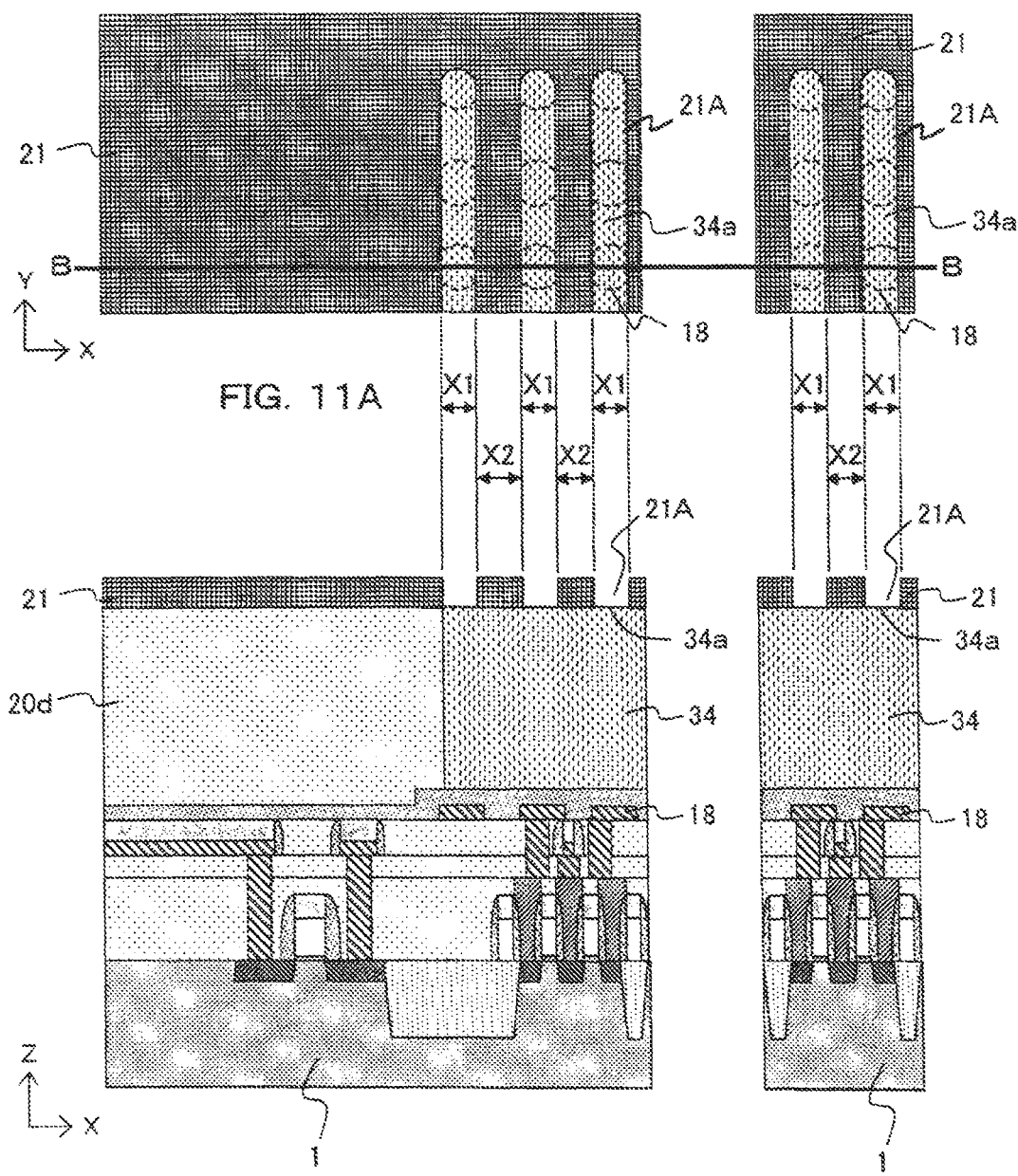
FIG. 11A is a plan view explanatory of a step following the step of FIGS. 10A and 10B.
FIG. 11B shows a vertical cross-section taken along a line B-B of FIG. 11A.

Next, in order to obtain a state shown in FIGS. 11A and 11B, a support film (third insulating film) 21 is deposited so that the second insulating film 20 and the second sacrifice film 34 are covered with the support film 21. The support film 21 may be a silicon nitride film having a thickness of 100 nm. The support film 21 may be formed by a CVD method or ALD (Atomic Layer Deposition) method.

Then a first pattern forming step is conducted to form a plurality of openings (first openings) 21A in the support film 21 by photolithography and dry etching method. Part of the upper surface of the amorphous carbon film 34 is exposed in the openings 21A. Those openings 21A are formed so that at least part of the openings 21A is located above the contact pads 18. For example, the openings 21A may be in the form of linear grooves extending along the Y-direction (first direction) that correspond to a plurality of contact pads 18 being arrayed. In this case, a plurality of openings 21A are arranged in parallel to each other along the X-direction (second direction) perpendicular to the Y-direction. For example, the width X1 of the openings 21A may be 70 nm, and the interval X2 of the openings 21A may be 70 nm. In the openings 21A formed by the first pattern forming step, the exposed parts of the upper surface 34a of the second sacrifice film 34 include lower electrode formation regions (18 in FIG. 11A) located above the contact pads 18 in vertical direction and second sacrifice film etching opening regions (34a in FIG. 11A) each of which is located between adjacent two lower electrode formation regions and used to remove all of the second sacrifice film 34. That is, in this embodiment, the second sacrifice film etching opening is formed in the support film 21 (third insulating film) before lower electrodes are formed.

Figures 12A, 12B:
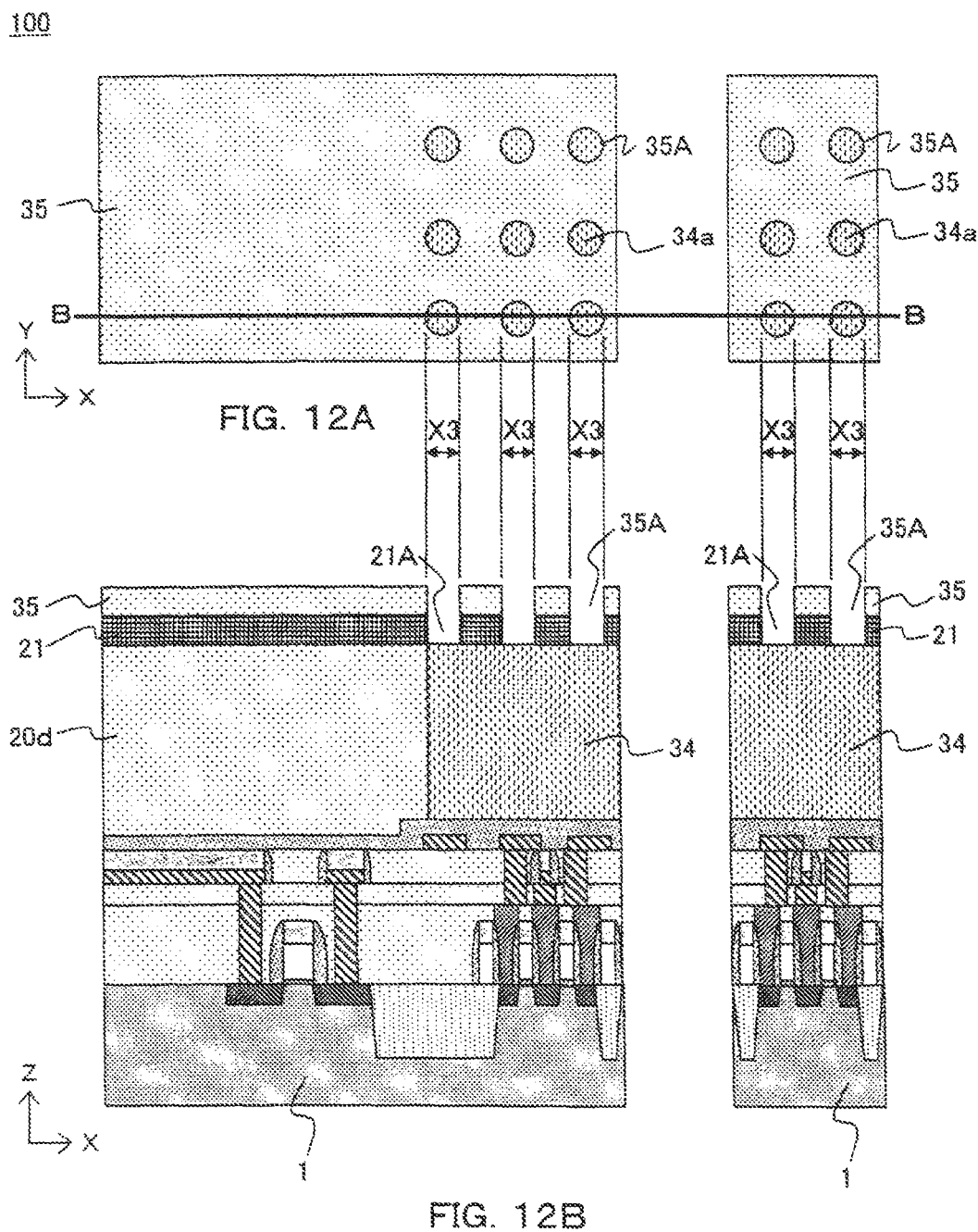
FIG. 12A is a plan view explanatory of a step following the step of FIGS. 11A and 11B.
FIG. 12B shows a vertical cross-section taken along a line B-B of FIG. 12A.

Subsequently, in order to obtain a state shown in FIGS. 12A and 12B, a mask film (forth insulating film) 35 is deposited over the entire surface of the substrate 1 so that the support film 21 is covered with the mask film 35 and that the openings 21A are filled with the mask film 35. For example, the mask film 35 may be a silicon oxide film having a thickness of 100 nm that is formed by a CVD method.

Thereafter, a second pattern forming step is conducted to form openings (second openings) 35A in the mask film 35 (forth insulating film) by photolithography and dry etching method. The openings 35A are positioned so as to overlap at least part of the openings 21A extending linearly in the Y-direction as seen in the plan view (along the Z-direction). In other words, the openings 35A are formed so as to have areas that overlap the openings 21A at certain locations in the plan view. The overlapped areas are located above the contact pads 18 in vertical direction. For example, the openings 35A may be in the form of circular holes having a diameter X3 of 70 nm. Thus, part of the upper surface 34a of the second sacrifice film 34 exposed in the openings 21A is exposed in areas in which the openings 35A overlap the openings 21A.

Figure 13A:
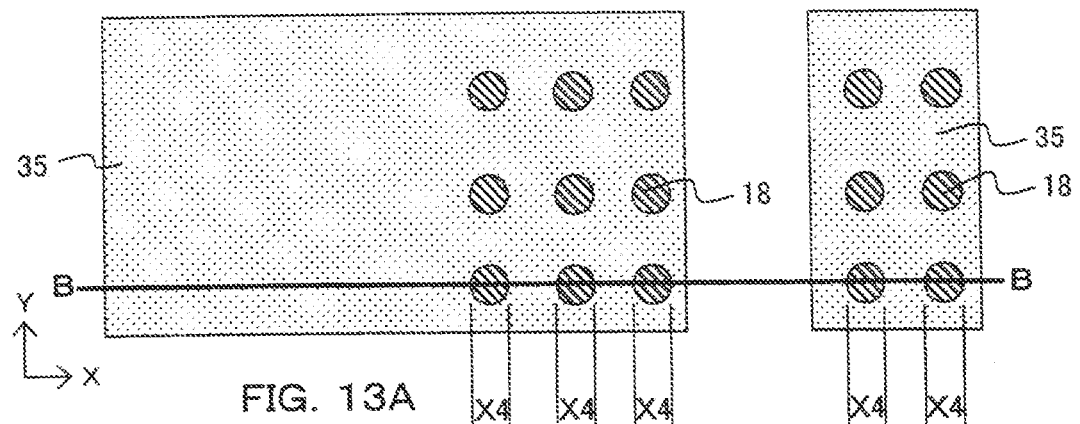
FIG. 13A is a plan view explanatory of a step following the step of FIGS. 12A and 12B.
Figure 13B:
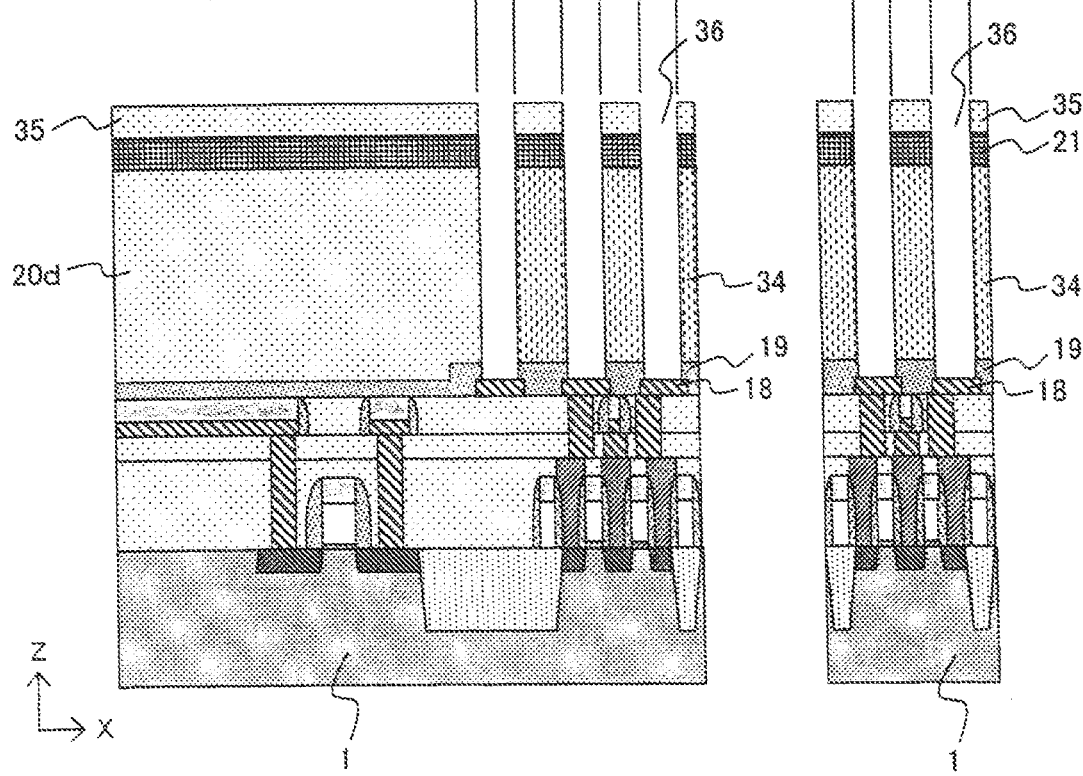
FIG. 13B shows a vertical cross-section taken along a line B-B of FIG. 13A.

Next, as shown in FIGS. 13A and 13B, while the mask film 35 having the openings 35A is used as a mask, the amorphous carbon film 34 of which the upper surface 34a exposed at the bottom of the openings 35A is dry-etched anisotropically. Thus, holes extending through the mask film (forth insulating film) 35, the support film (third insulating film) 21, and the second sacrifice film 34, i.e., cylindrical holes 36 are formed. At that time, part of the cover film 19 (fifth insulating film) is exposed at the bottom of the cylindrical holes 36.

For example, the following dry etching conditions may be used for forming the cylindrical holes 36 in a case where the second sacrifice film 34 is made of the amorphous carbon film. Ammonia ($NH_3$) and oxygen ($O_2$) are used as raw material gases, the flow rate of $NH_3$ is set at 300 sccm, and the flow rate of $O_2$ is set at 30 sccm. The source power is set at 800 W, the bias power is set at 50 W, the stage temperature is set at 50° C., and the pressure is set at 20 mTorr. Under the above conditions, argon (Ar) may be supplied as a carrier gas at 200 sccm. The bias power is not limited to a specific value (e.g., 50 W) and may be changed within a certain range (e.g., from 50 W to 300 W).

By adjusting the bias power within the aforementioned range, for example, the amorphous carbon film can be dry-etched anisotropically. Therefore, the diameter X4 of the cylindrical holes 36 formed in the amorphous carbon film can be made equal to the diameter X3 of the openings 35A (e.g., 70 nm). On the anisotropic dry etching conditions mentioned above, silicon oxide film constituting the mask film 35 (forth insulating film) and silicon nitride film constituting the cover film 19 (fifth insulating film) can not be etched. Therefore, the mask film 35 and the cover film 19 remain as they were before the dry etching. That is, the cylindrical holes 36 can be formed without causing damage to other structures.

On the other hand, the following dry etching conditions may be used in a case where the second sacrifice film 34 is made of the amorphous silicon film. A mixed gas of hydrogen bromide ($NH_3$), chlorine ($Cl_2$) and oxygen is used as a raw material gas. The flow rates of them are set at 100 sccm, 100 sccm and 10 sccm, respectively. The pressure is set at 4 mTorr, the high frequency power is set at 500 W and the bias power is set at 50 W. Applying the bias power enables anisotropic dry etching to the amorphous silicon film like in a case of the amorphous carbon film. The mask film 35 made of the silicon oxide film is etched by 7 nm at the maximum while the amorphous silicon film is etched by 1000 nm. Therefore, the cylindrical holes 36 can be also formed without causing damage to other structures in the case where the amorphous silicon film is used as the second sacrifice film 34. In each case of the amorphous carbon film and the amorphous silicon film, the cylinder holes 36 having vertical sidewalls can be formed without causing bowing to the sidewalls because plasma of etching gas including fluorine is not used Next, the cover film 19 (fifth insulating film) remaining at the bottom of the cylindrical holes 36 is removed by anisotropic dry etching under varied conditions, so that at least part of the upper surface of the contact pads 18 is exposed. For example, the following dry etching conditions may be used: Trifluoromethane ($CHF_3$) and oxygen ($O_2$) are used as raw material gases, the flow rate of $CHF_3$ is set at 80 sccm, and the flow rate of $O_2$ is set at 20 sccm. The high-frequency power is set at 3,000 W, the stage temperature is set at 20° C., and the pressure is set at 30 mTorr. Under the above conditions, argon (Ar) may be supplied as a carrier gas at 150 sccm. The dry etching conditions are set so that the cover film 19 (fifth insulating film) has a selectivity higher than other films. Therefore, only the cover film 19 of which the upper surface is exposed at the bottom of the cylindrical holes 36 A is dry-etched. As a result, the mask film 35 and the contact pads 18 remain as they were before the dry etching.

In the aforementioned manner, the state shown in FIGS. 13A and 13B is obtained.

Figure 14A:
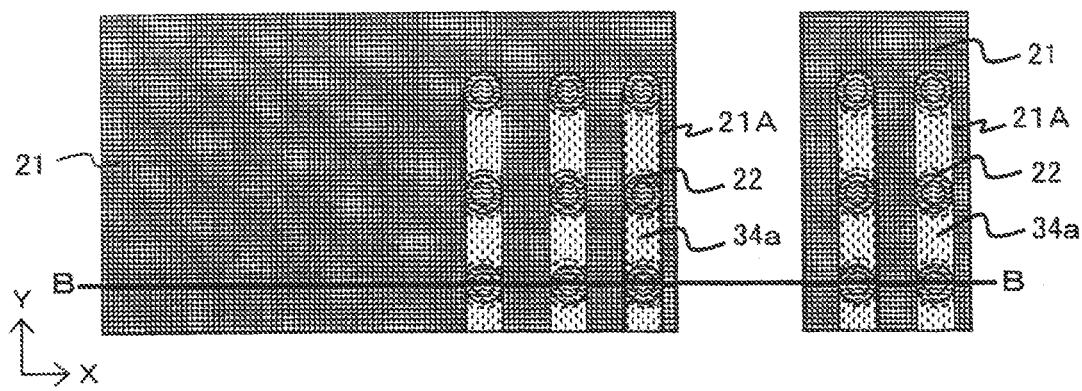
FIG. 14A is a plan view explanatory of a step following the step of FIGS. 13A and 13B.
Figure 14B:
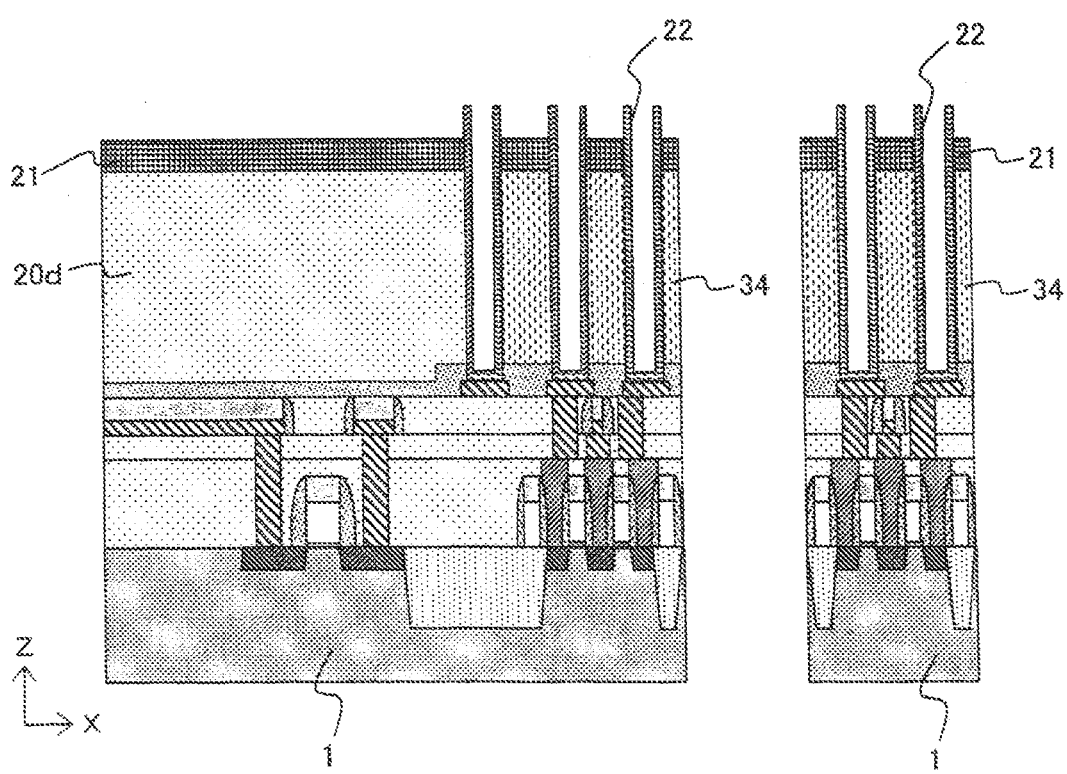
FIG. 14B shows a vertical cross-section taken along a line B-B of FIG. 14A.

Next, in order to obtain a state shown in FIGS. 14A and 14B, a conductive film (22) is formed so as to cover inner surfaces of the cylindrical holes 36. This conductive film will become lower electrodes 22 (and a guard ring).

For example, a metal film of titanium nitride (TiN), ruthenium (Ru), platinum (Pt), or the like may be used for the conductive film. The titanium nitride film may be formed by using a CVD method. For example, the thickness of the conductive film is 10 nm.

The conductive film is also formed on the mask film 35. The conductive film formed on the mask film 35 is removed by, for example, a CMP method. Thus, the conductive film becomes lower electrodes 22 connected to the upper surface of the contact pads 18 at the bottoms thereof and having a shape shown in FIGS. 14A and 14B. Then the mask film 35 is completely removed.

For example, the mask film 35 made of the silicon oxide film can be removed by wet etching using a solution including hydrofluoric acid (HF). At that time, the upper surface of the second insulating film 20d is covered with the support film 21 (third insulating film) made of silicon nitride film while the side surfaces in the cylinder holes 36 are covered with the conductive film (22). Accordingly, the second insulating film 20d remains after etching for the mask film 35 even if it is made of the silicon oxide film.

As shown in FIG. 14A, the openings 21A formed in the support film 21 and extending in the Y-direction are exposed after the mask film 35 is removed. Hereby parts of the upper surface of the second sacrifice film 34 are exposed at the bottoms of the openings 21 except for the region at which the lower electrodes 22 are formed. However, the amorphous carbon film and the amorphous silicon film does not dissolve in the solution including hydrofluoric acid. As a result, the second sacrifice film 34 remains as it was before the dry etching.

Figure 15A:
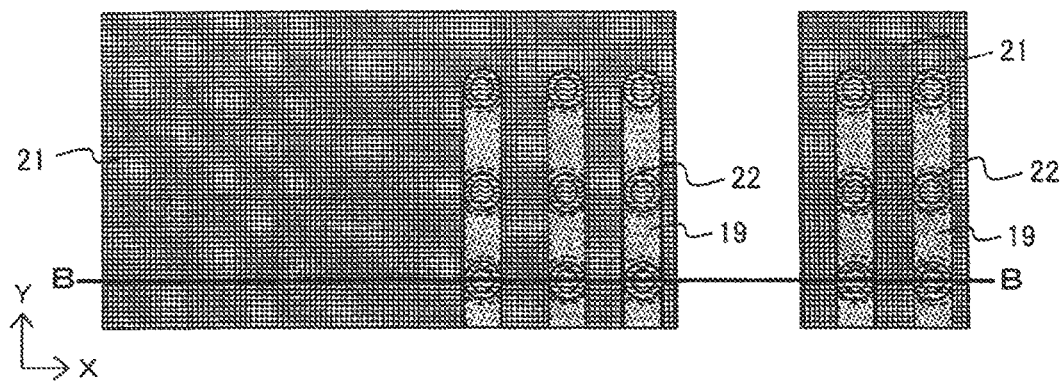
FIG. 15A is a plan view explanatory of a step following the step of FIGS. 14A and 14B.
Figure 15B:
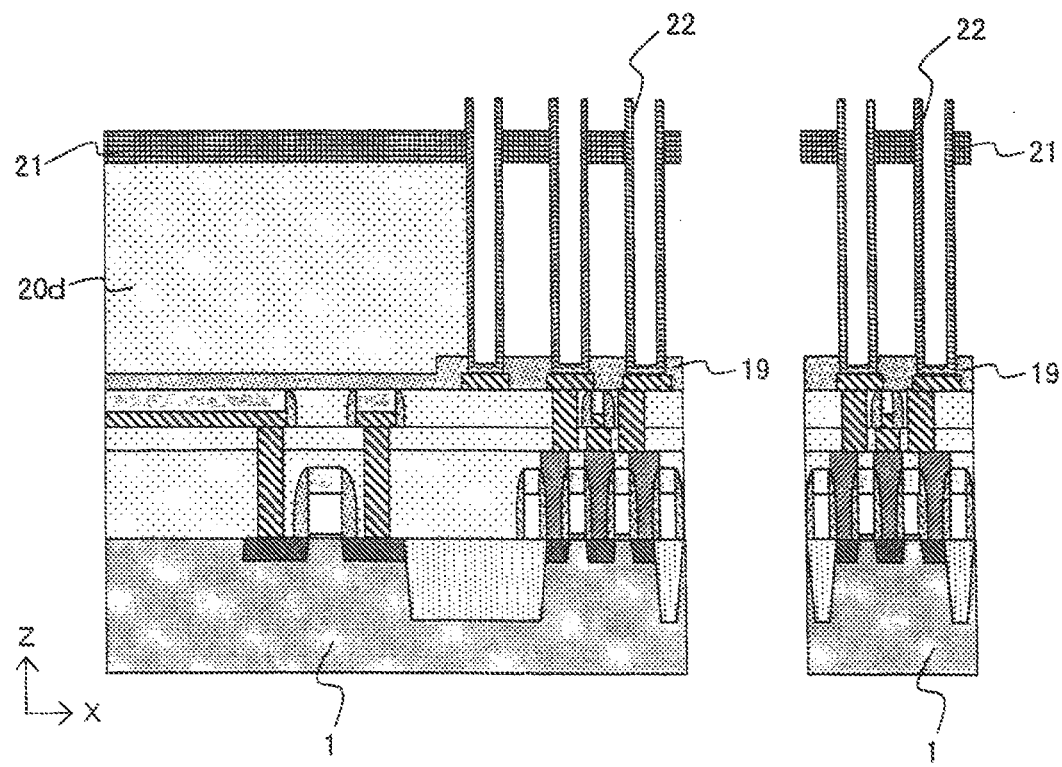
FIG. 15B shows a vertical cross-section taken along a line B-B of FIG. 15A.

Next, as shown in FIGS. 15A and 15B, all of the second sacrifice film 34 is removed. Removal of the second sacrifice film 34 is performed via the openings 21A formed in the support film 21 (third insulating film). Specifically, the etching of the second sacrifice film 34 advance isotropically downwards from the upper surface of the second sacrifice film 34 exposed in the openings 21A. Hereby the second sacrifice film 34 around the lower electrodes 22 is removed to obtain the crown type lower electrodes 22 of which inner and outer surfaces are exposed. If the second insulating film 20d is made of a material which has an etching characteristics similar to that of the second sacrifice film 34, the etching advances into the second insulating film 20d in the peripheral circuit region 102 when the sidewall of the second insulating film 20d is exposed by the isotropic etching for the second sacrifice film 34. As a result, part of the second insulating film 20d is lost. In order to avoid this, the second insulating film should be made of a material which is not etched when the second sacrifice film 34 is removed. In this embodiment, the silicon oxide film or the like is used as the second insulating film 20d while the amorphous carbon film of the amorphous silicon film is used as the second sacrifice film 34.

In a case where the second sacrifice film 34 is made of the amorphous carbon film, ashing is conducted on the amorphous carbon film. For example, the following ashing conditions may be used: Oxygen ($O_2$) is used as a raw material gas, the flow rate is set at 3,000 sccm, and the source power is set at 3,000 W. The bias power is set at 0 W, the stage temperature is set at 200° C., and the pressure is set at 0.3 Torr. The pressure is not limited to a specific value (0.3 Torr) and can be changed within a certain range (from 0.3 Torr to 1.0 Torr). In this ashing process, because the bias power is not applied, the etching is isotropic. As a result, it is possible to remove not only part of the amorphous carbon film located below the openings 21A, but also part of the amorphous carbon film located below the support film 21.

Additionally, the amount of the raw material gas supplied from the openings 21A to the amorphous carbon film can be increased by application of a bias power with keeping isotropic etching. For example, the bias power can be adjusted within a range of 0 W to 100 W. A period of time required for ashing can be shortened by increasing the amount of the raw material gas supplied from the openings 21A to the amorphous carbon film.

Under the aforementioned ashing conditions, other structures than the amorphous carbon film are not etched. Therefore, the second insulating film 20d, the support film 21 (third insulating film), the lower electrodes 22, and the cover film 19 (fifth insulating film) remains as they were before the ashing. Accordingly, the second insulating film 20d remains connected to the support film 21.

On the other hand, in a case where the second sacrifice film 34 is made of the amorphous silicon film, the semifabricated product is immersed in ammonia solution to conduct wet etching process for removing the second sacrifice film 34. Because the wet etching is isotropic, it is possible to remove not only part of the amorphous silicon film located below the openings 21A, but also part of the amorphous silicon film located below the support film 21. As mentioned above, addition of imparities into the amorphous silicon film can increase etching rate of the amorphous silicon film by 1.5 times in comparison with the amorphous silicon film with no imparities. Furthermore, by setting temperature of the ammonia solution at 60° C. to 80° C., preferably at 70° C., the etching rate of the amorphous silicon film is increased by about 1.5 times in comparison with a case of 20° C. By combining above mentioned two methods, the etching rate of the amorphous silicon film is increased by about two times. In other words, it is possible to shorten process time and thereby increasing productivity. The ammonia solution do not etch other structures than the amorphous silicon film. Therefore, the second insulating film 20d, the support film 21 (third insulating film), the lower electrodes 22, and the cover film 19 (fifth insulating film) remains as they were before the wet etching. Accordingly, the second insulating film 20d remains connected to the support film 21.

Figure 16A:
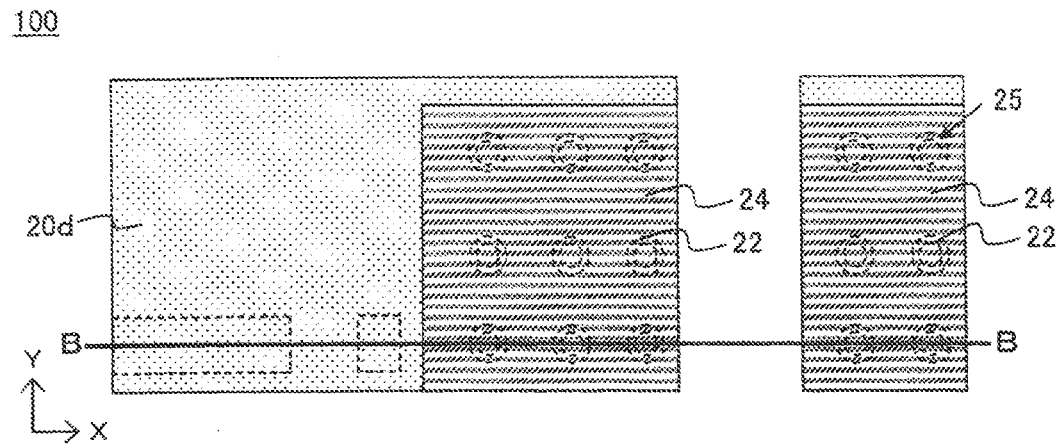
FIG. 16A is a plan view explanatory of a step following the step of FIGS. 15A and 15B.
Figure 16B:
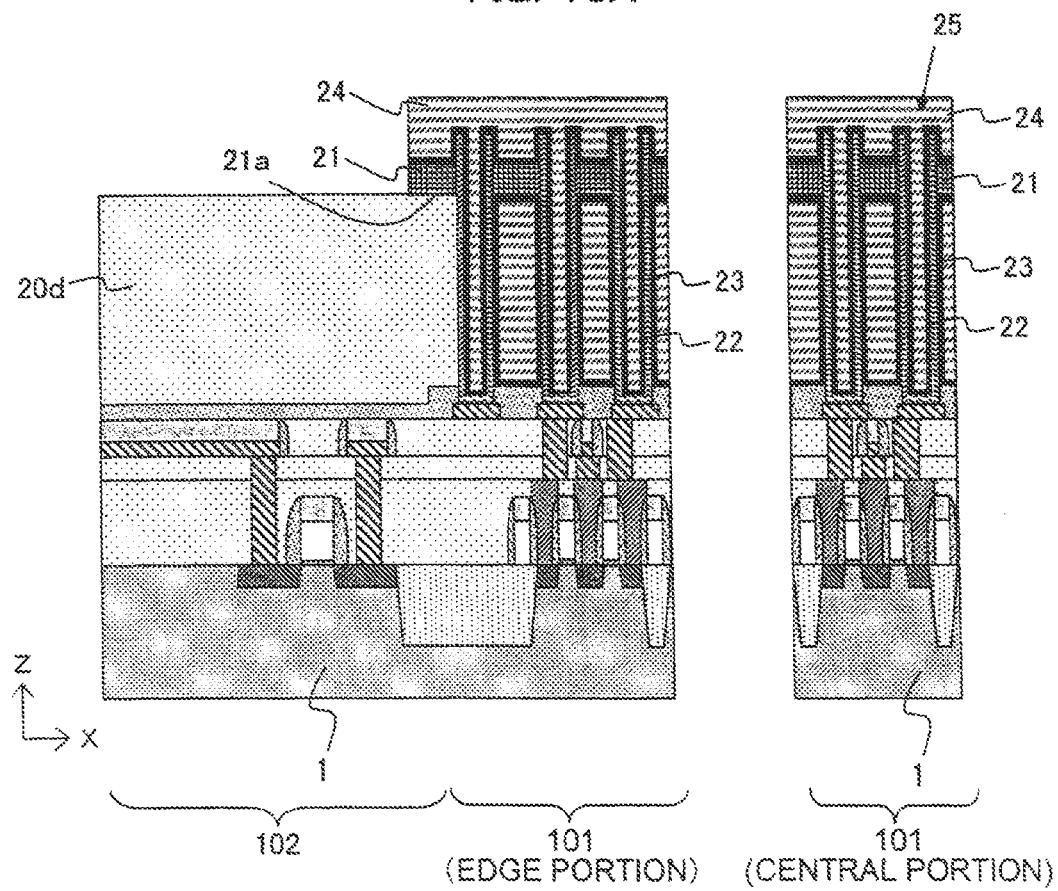
FIG. 16B shows a vertical cross-section taken along a line B-B of FIG. 16A.

Next, in order to obtain a state shown in FIGS. 16A and 16B, a capacitance insulating film 23 is formed so as to cover exposed surfaces of the lower electrodes 22. High-dielectric films such as zirconium oxide ($ZrO_2$), aluminum oxide ($Al_2O_3$), and hafnium oxide ($HfO_2$) or multilayered films of those high-dielectric films may be used for the capacitance insulating film 23. The capacitance insulating film 23 may be formed by using an atomic layer deposition (ALD) method. Because the ALD method uses surface adhesion, it is excellent at step coverage. Therefore, by the use of the ALD method, the capacitance insulating film 23 is also formed on a rear surface of the support film 21 and has a uniform thickness.

Then an upper electrode 24 is formed so as to cover a surface of the capacitance insulating film 23. For example, a titanium nitride film may be used for the upper electrode 24. Alternatively, the upper electrode 24 may have a multilayer structure produced as follows: A titanium nitride film is formed with a film thickness of about 10 nm, and a polysilicon film into which impurities have been doped is stacked on the titanium nitride film so as to fill the cavities between adjacent lower electrodes 22. Then tungsten (W) is deposited with a thickness of about 100 nm on the polysilicon film. Furthermore, a metal film of ruthenium (Ru), platinum (Pt), or the like may be used instead of titanium nitride. Thus, there is produced a crown type capacitor structure in which a lower electrode 22 and an upper electrode 24 are opposed to each other with a capacitance insulating film 23 interposed therebetween.

Subsequently, unnecessary films in the peripheral circuit region 102 (the upper electrode 24, the capacitance insulating film 23, and the support film 21) are removed by anisotropic dry etching with use of a photoresist film (not shown) as a mask. Thus, the state shown in FIGS. 16A and 16B is obtained, and a plurality of crown type capacitors 25 are formed in the memory cell region 101. For the anisotropic dry etching, the mask should have a pattern to form a state that an rear surface 21a of an edge portion of the support film 21 comes into contact with and lies on the upper surface of the second insulating film 20d formed in the peripheral circuit region 102. In that state, the support film 21 is fixed by the second insulating film 20d serving as a supporting base material. With this structure, mechanical strength is increased and it is possible to prevent the capacitors 25 from being collapsed or broken.

Since the support film 21 has been removed in the peripheral circuit region 102, deep contact plugs (sixth contact plugs 33 of FIG. 4) extending through the second insulating film (fourth interlayer dielectric) 20d can readily be formed in the peripheral circuit region 102. Additionally, it is not necessary to remove the support film 21 located in the peripheral circuit region 102. The support film 21 may remain in the peripheral circuit region 102

Thereafter, in order to obtain a state shown in FIG. 4, a fifth interlayer dielectric 26 is formed so as to cover a surface of the upper electrode 24. Then a surface of the fifth interlayer dielectric 26 is flattened. For example, the fifth interlayer dielectric 26 may be a silicon oxide film. Furthermore, the surface of the fifth interlayer dielectric 26 may be flattened by using CMP method.

Subsequently, fourth contact plugs 27 and second wires 28 for providing a certain potential to the upper electrodes 24 are formed. Sixth contact plugs 33 are also formed concurrently with formation of the fourth contact plugs 27.

Then a surface protective film and the like are formed. Thus, a semiconductor device (DRAM) 100 is completed.

As described above, in a method of manufacturing a semiconductor device 100 according to the present embodiment, a second insulating film 20d is formed in a peripheral circuit region 102 after a second sacrifice film 34 is formed to cover a memory cell region 101, then a support film 21 is stacked on the second insulating film 20d and the second sacrifice film 34 adjacent to the second insulating film 20. Cylindrical holes 36 are formed so as to extend through the stacked films of the support film 21 and the second sacrifice film 34. Lower electrodes 22 are formed so that the interior of the cylindrical holes 36 are coated with the lower electrodes 22. Part of the lower electrodes 22 formed by such a manufacturing method is connected to the support film 21. The support film 21 is further connected to the second insulating film 20. Therefore, even if the second sacrifice film 34 is removed in such a state, the lower electrodes 22 are supported by the support film 21, which is connected to the second sacrifice film 20d. Accordingly, the lower electrodes 22 are prevented from being collapsed.

Furthermore, the method of manufacturing the semiconductor device 100 according to the present embodiment includes: a first pattern forming step which forms first openings 21A having linear shape in a support film 21 to be extended in a first direction; a second pattern forming step which forms a fourth insulating film 35 filling the first openings 21A on the entire surface and forms circular holes as second openings 35A in the forth insulating film 35 to be located above contact pads 18 in vertical direction; and a step which forms cylindrical holes 36 by anisotropic dry etching on the second sacrifice film 34 of which an upper surface is exposed in the second openings 35A using the fourth insulating film 35 as a mask. In the first pattern forming step, the first openings 21A having linear shape are formed to be extended in the first direction. In the first openings 21A, the upper surface 34a of the second sacrifice film 34 is exposed. The exposed surface 34a includes parts to be lower electrode formation regions located above the contact pads 18 in vertical direction and other parts to be etching opening regions located between adjacent lower electrode formation regions and used to remove all of the second sacrifice film 34. That is, in this embodiment, the etching opening is formed in the support film 21 before lower electrodes are formed.

Second Embodiment

Next, a method of manufacturing a semiconductor device 200 according to a second preferred embodiment of the present invention will be described with reference FIGS. 17A to 18B. Though the second openings are formed as individual holes in the first embodiment, second openings are formed as linear grooves each of which is corresponding to a plurality of holes in the present embodiment. In the manufacturing method of this embodiment, steps to form openings 21A in the support film 21 are the same as in the first embodiment (FIGS. 5A to 11B), and the explanation thereof is omitted herein.

As illustrated in FIGS. 11A and 11B, a first pattern forming step is conducted to form a plurality of openings (first openings) 21A in the support film 21 (third insulating film) to be extended in the Y-direction (first direction). Thereafter, in order to obtain a state shown in FIGS. 17A and 17B, a mask film (forth insulating film) is deposited to cover the support film 21 and to fill the openings 21A. A silicon oxide film is used as the mask film 35. The mask film 35 may be formed by a CVD method. The mask film, for example, is 100 nm in thickness.

Figure 17A:
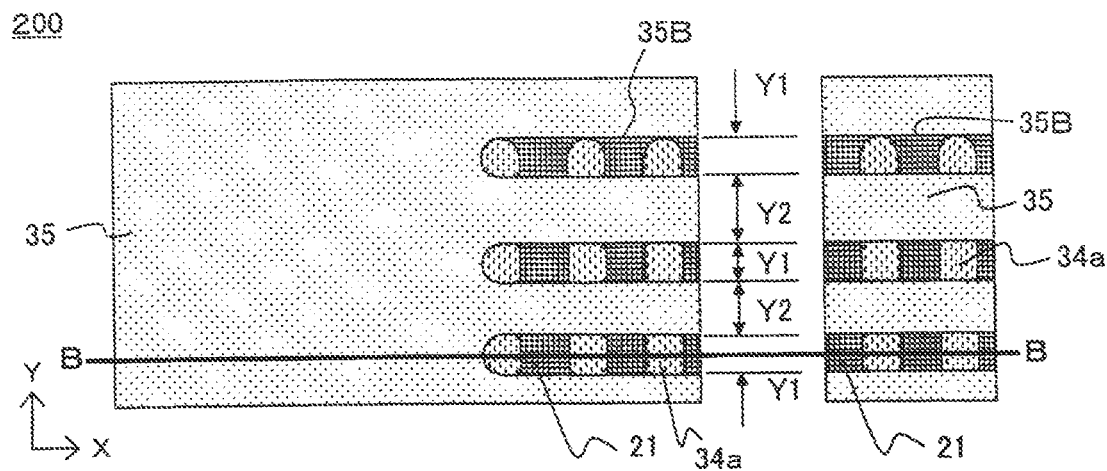
FIG. 17A is a plan view explanatory of a method of manufacturing a semiconductor device according to a second embodiment of the present invention.
Figure 17B:
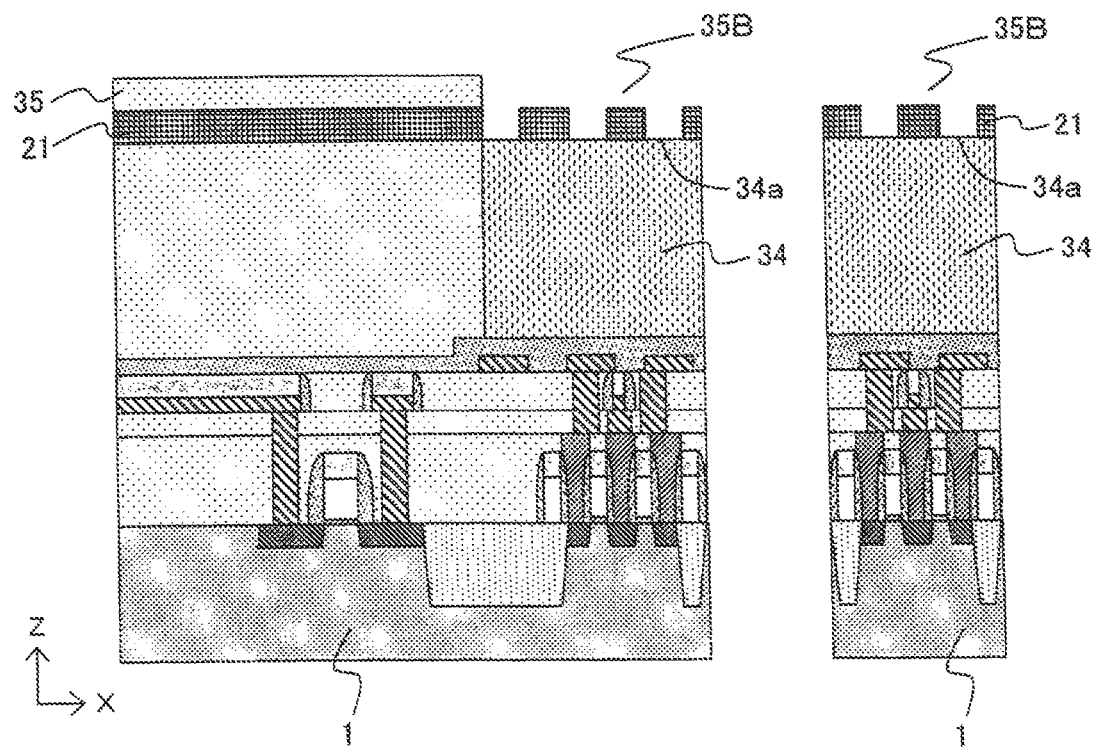
FIG. 17B shows a vertical cross-section taken along a line B-B of FIG. 17A.

Next, a second pattern forming step is conducted to form openings, which are linear grooves, in the mask film 35 by using photolithography and dry etching method. In anisotropic dry etching to form the openings 35B, etching conditions are employed so that an etching rate of a silicon nitride film constituting the support film 21 is lower than that of a silicon oxide film constituting the mask film 35. Hereby the support film 21 exposed in the openings 35B is not etched and remains as it was. The openings (second openings) 35B are formed so as to have areas that overlap the openings 21A formed in the support film 21 at certain locations (so as to cross the openings 21A). The overlapped areas are located above the contact pads 18 in vertical direction. When the contact pads 18 are arranged along the X-direction and the Y-direction, the openings 35B are arranged so as to be extended in the X-direction perpendicular to the Y-direction as linear grooves while the openings 21A are formed as linear grooves extended in the Y-direction. In FIG. 17A, each of the openings 35B extends along the X-direction. As seen in the plan view, each of the openings 35B is arranged such that the opening 35B overlaps at least part of the openings 21A. With such an arrangement, part of the upper surface of the support film 21 in which the openings (first openings) 21A are formed and part of the second sacrifice film 34 that is exposed at the bottom of the openings (first openings) 21A are exposed within the openings 35B. For example, the width Y1 of the groove-like openings 35B is 70 nm.

In the first embodiment, the openings 35A are in the form of individual circular holes corresponding to the contact pads 18. Therefore, if the diameter X3 of the openings 35A is reduced in order to miniaturize the semiconductor device 100, the openings 35A may be difficult to be formed. In contrast, according to the present embodiment, the openings 35B are in the form of grooves extending linearly. Accordingly, the openings 35B can be formed stably even if the semiconductor device 200 is further miniaturized.

Figure 18A:
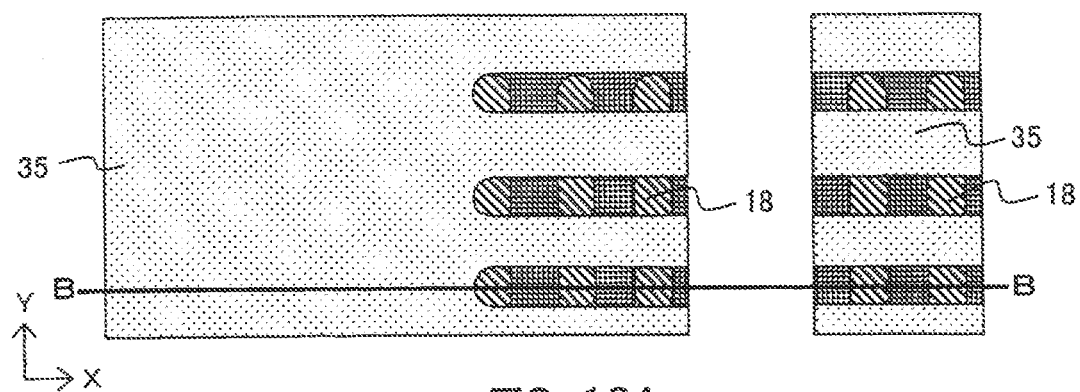
FIG. 18A is a plan view explanatory of a step following the step of FIGS. 17A and 17B.
Figure 18B:
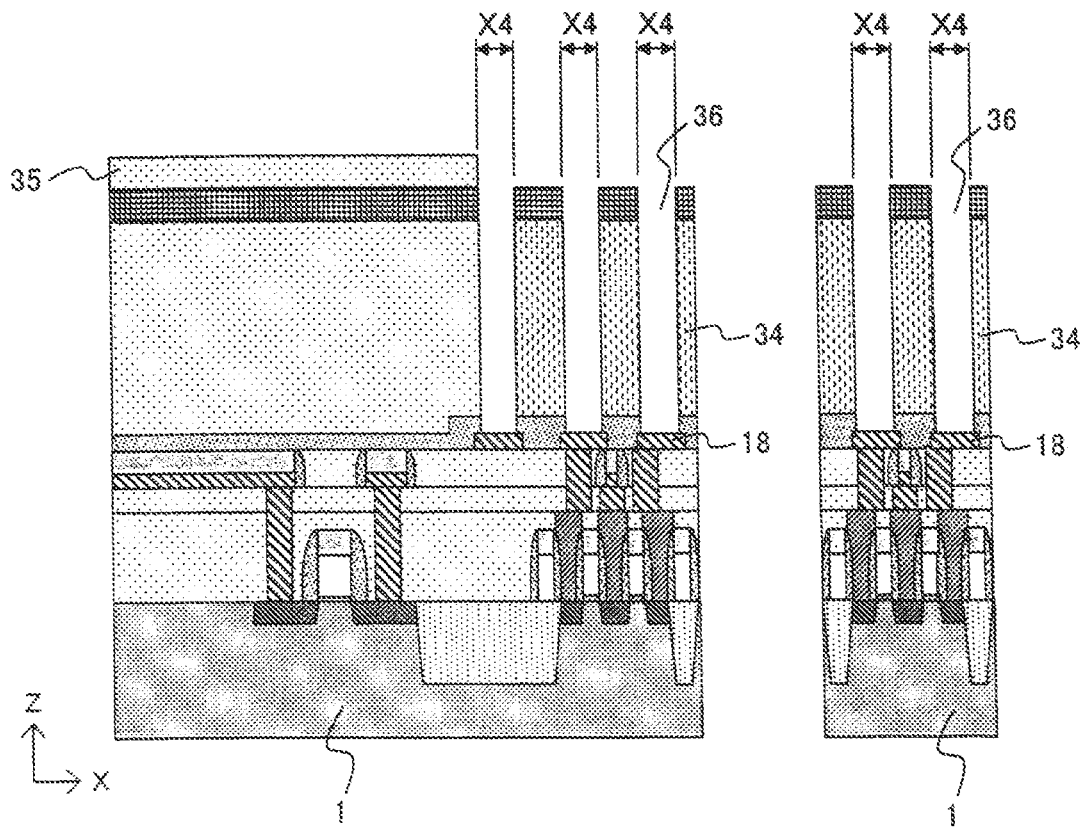
FIG. 18B shows a vertical cross-section taken along a line B-B of FIG. 18A.

Referring to FIGS. 18A and 18B, while the mask film (forth insulating film) 35 having the openings 35B and the support film (third insulating film) 21 having the openings 21A are used as a mask, the upper surface of the second sacrifice film 34 exposed at the bottom of the openings 35B is anisotropic dry-etched as with the first embodiment. Subsequently, the cover film 19 remaining at the bottom of the cylindrical holes 36 is removed by anisotropic dry etching under varied conditions, so that at least part of the contact pads 18 is exposed. After that, the same steps as in the first embodiment are performed.

As described above, a method of manufacturing a semiconductor device includes: a first pattern forming step which forms first openings 21A in a support film 21 formed on a second sacrifice film 34 to be extended in a first direction; a second pattern forming step which forms a fourth insulating film 35 filling the first openings 21A on the entire surface and forms second openings 35B in the forth insulating film 35 to be extended in a second direction perpendicular to the first direction; and a step which forms cylindrical holes 36 by anisotropic dry etching on the second sacrifice film 34 of which an upper surface is exposed in the second openings 35B using the fourth insulating film 35 and the support film 21 of which an upper surface is exposed in the second openings 35B as a mask. That is the method cylindrical hole forming regions are exposed by double patterning method. Therefore, accordingly, the cylindrical holes 36 can be formed stably even if the semiconductor device is further miniaturized and product yield ration is increased.

Third Embodiment

Next, a method of manufacturing a semiconductor device 300 according to a third preferred embodiment of the present invention will be described with reference FIG. 19. Thought the capacitors 25 are formed as a crown type in the first embodiment, capacitors of the present embodiment are formed as a pillar type. In other respects, the present embodiment is the same as the first embodiment, and the explanation thereof is omitted herein.

Figure 19:
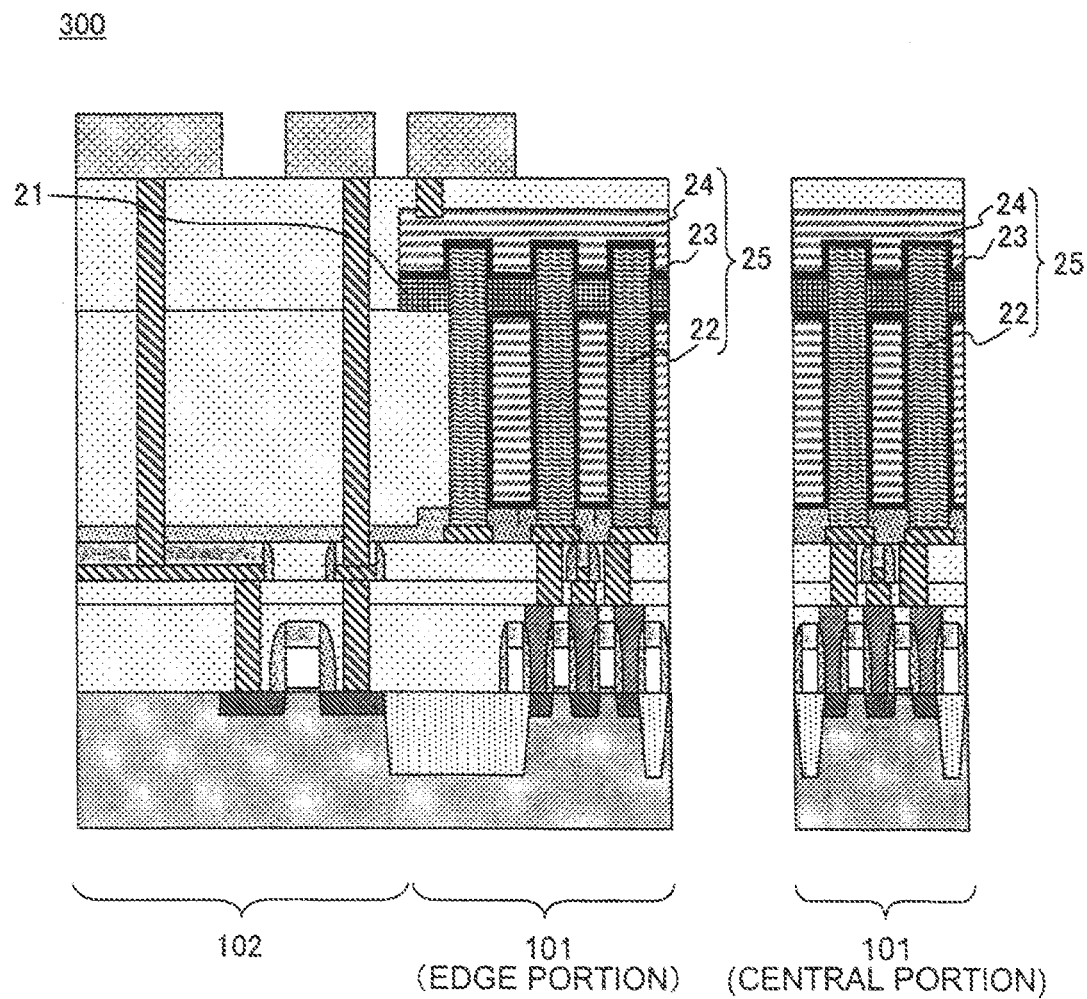
FIG. 19 is a vertical cross-sectional view explanatory of a method of manufacturing a semiconductor device according to a third embodiment of the present invention.

Referring to FIG. 19, capacitors each of which is formed of a lower electrode 22, a capacitance insulating film 23 and an upper electrode 24 are not a crown type of the first embodiment shown in FIG. 4 but a pillar type. After the cylindrical holes 36 are formed at the step of FIGS. 13A and 13B, a conductive film to be the lower electrodes 22 is formed to fill the cylindrical holes 36 on the entire surface at a step as a substitute for the step of FIGS. 14A and 14B. In a case where the cylindrical holes 36 have a diameter of 70 nm, when the conductive film, for example, has a thickness of 50 nm, the cylindrical holes are filled with the conductive film. Thereafter the part of the conductive film formed on the mask film 35 is removed by a CMP method while the other parts of the conductive film formed in the cylindrical holes 36 remain as they were. Thus the lower electrodes 22 of the pillar type are formed in the cylindrical holes 36.

Formation of the crown type capacitor of the first embodiment becomes difficult as the semiconductor device is miniaturized. In contrast, it is easy to form the pillar type capacitors even if the semiconductor device is miniaturized because it is unnecessary to form capacitors in the cylindrical holes.

Although preferred embodiments of the present invention have been described above, the present invention is not limited to the aforementioned embodiments. As a matter of course, various modifications can be made therein without departing from the spirit of the present invention, and those modifications should be included in this present invention.

What is claimed is:

1. A method of manufacturing a device, the method comprising:
  forming a fifth insulating film on a semiconductor substrate having a peripheral circuit region and a memory cell region in which a contact pad is formed;
  forming a second sacrifice film in the memory cell region in which the fifth insulating film is formed;
  forming, after the forming of the second sacrifice film, a second insulating film in the peripheral circuit region on the semiconductor substrate to have a sidewall coming into contact with the second sacrifice film;
  forming a third insulating film to cover an upper surface of the second sacrifice film and an upper surface of the second insulating film;

forming a hole penetrating through the third insulating film, the second sacrifice film and the fifth insulating film in the memory cell region, the hole exposing a sidewall of the second insulating film;

forming a lower electrode in the hole; and removing all of the second sacrifice film.

2. The method as recited in claim 1, wherein the second insulating film is made of a material which is not etched by the removing of all of the second sacrifice film.

3. The method as recited in claim 2, wherein the second sacrifice film comprises an amorphous carbon film.

4. The method as recited in claim 3, wherein the removing of all of the second sacrifice film is executed by isotropic etching using oxygen plasma asking.

5. The method as recited in claim 2, wherein the second sacrifice film comprises an amorphous silicon film.

6. The method as recited in claim 5, wherein the removing of all of the second sacrifice film is executed by isotropic etching using ammonia solution.

7. The method as recited in claim 2, wherein the second insulating film comprises a single layer film selected from a silicon oxidized film, a silicon nitride film and silicon oxynitride film, or a stacked film including two or more selected from them.

8. The method as recited in claim 1, wherein each of the fifth insulating film and the third insulating film comprises a silicon nitride film.

9. The method as recited in claim 1, wherein the forming of the second sacrifice film further comprises:

forming a first sacrifice film on the fifth insulating film; and removing a part of the first sacrifice film formed in the peripheral circuit region to make a remaining part of the first sacrifice film in the memory cell region the second sacrifice film.

10. The method as recited in claim 1, wherein the forming of the second insulating film further comprises:

forming a first insulating film to cover an upper surface of the second sacrifice film in the memory cell region and the peripheral circuit region; and removing a part of the first insulating film located higher than an upper surface of the second sacrifice film to make a remaining part of the first insulating film in the peripheral circuit region the second insulating film.

11. The method as recited in claim 1, wherein the forming of the hole further comprises:

etching the third insulating film to form a first opening having a linear shape extending in a first direction;

forming a forth insulating film on entire surface to fill the first opening;

etching the forth insulating film to form a second opening overlapping at least a part of the first opening at a certain position;

anisotropically dry etching the second sacrifice film of which an upper surface is partly exposed in the second opening; and etching the fifth insulating film located lower than the second sacrifice film to expose an upper surface of the contact pad.

12. The method as recited in claim 11, wherein the certain position is a position just above the contact pad, the position corresponding to a planar position of the contact pad.

13. The method as recited in claim 11, wherein the fourth insulating film comprises a silicon oxidized film.

14. The method as recited in claim 11, wherein the removing of all of the second sacrifice film comprises:

removing the fourth insulating film; and thereafter isotropic etching the second sacrifice film from a part of the upper surface of the second sacrifice film exposed in a second sacrifice film etching opening area, using a part of the first opening except for a part occupied by the lower electrode as the second sacrifice film etching opening area.

15. The method as recited in claim 14, wherein the second sacrifice film etching opening area is formed before the forming of the lower electrode.

16. The method as recited in claim 11, wherein the second opening is formed into a shape of a circular hole formed at the certain position in the first opening.

17. The method as recited in claim 11, wherein the second opening is formed into a shape of a linear groove extending in a second direction perpendicular to the first direction to stretch over a plurality of the first openings each of which has the linear shape extending the first direction, the certain position being located at an intersection of the first opening and the second opening.

18. The method as recited in claim 1, wherein the forming of the lower electrode comprises forming a cylinder type lower electrode on the inner surface of the hole, the cylinder type lower electrode forming a crown type lower electrode by the removing of all of the second sacrifice film, and wherein the method further comprises, after the removing of all of the second sacrifice film, forming a capacitance insulating film and an upper electrode in order and thereby forming a crown type capacitor having the lower electrode, the capacitance insulating film and the upper electrode.

19. The method as recited in claim 1, wherein the forming of the lower electrode comprises forming a pillar type lower electrode filling the hole, and wherein the method further comprises, after the removing of all of the second sacrifice film, forming a capacitance insulating film and an upper electrode in order and thereby forming a pillar type capacitor having the lower electrode, the capacitance insulating film and the upper electrode.

20. The method as recited in claim 1, wherein the hole is a dummy trench.

* * * * *